(12) United States Patent
Doornbos et al.

(10) Patent No.: US 10,923,581 B2
(45) Date of Patent: Feb. 16, 2021

(54) METHOD FOR FORMING SEMICONDUCTOR STRUCTURE

(71) Applicant: Taiwan Semiconductor Manufacturing Co., Ltd., Hsinchu (TW)

(72) Inventors: Gerben Doornbos, Kessel-Lo (BE); Peter Ramvall, Lund (SE); Matthias Passlack, Huldenberg (BE); Carlos H. Diaz, Los Altos Hills, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/695,650

(22) Filed: Nov. 26, 2019

(65) Prior Publication Data

US 2020/0098898 A1 Mar. 26, 2020

Related U.S. Application Data

(62) Division of application No. 16/053,617, filed on Aug. 2, 2018, now Pat. No. 10,505,025.

(51) Int. Cl.
*H01L 21/8234* (2006.01)
*H01L 29/66* (2006.01)
(Continued)

(52) U.S. Cl.
CPC .. *H01L 29/66977* (2013.01); *H01L 21/02178* (2013.01); *H01L 21/02241* (2013.01); *H01L 21/30612* (2013.01); *H01L 21/8252* (2013.01); *H01L 27/092* (2013.01); *H01L 29/66522* (2013.01); *H01L 29/66742* (2013.01); *H01L 29/78609* (2013.01); *H01L 29/78618* (2013.01); *H01L 29/78642* (2013.01); *H01L 29/78681* (2013.01); *H01L 29/78696* (2013.01);
(Continued)

(58) Field of Classification Search
CPC ....... H01L 21/823487; H01L 29/66666; H01L 29/7827
See application file for complete search history.

(56) References Cited

U.S. PATENT DOCUMENTS 8,853,824 B1 10/2014 Wang et al.
9,620,585 B1 4/2017 Loechelt et al.
(Continued)

OTHER PUBLICATIONS

W. Li, D. Digiovanni et al., "III-N Heterojunctions for Tunnel Field-Effect Transistors," Least Sep. 11, 2016.
(Continued)

*Primary Examiner* — George R Fourson, III
(74) *Attorney, Agent, or Firm* — Birch, Stewart, Kolasch & Birch, LLP

(57) ABSTRACT

A method for manufacturing a semiconductor structure including forming a first type semiconductor layer. The method also includes forming a semiconductor interlayer over the first type semiconductor layer. The method further includes forming a second type semiconductor layer over the semiconductor interlayer. The method further includes etching the first type semiconductor layer, the semiconductor interlayer, and the second type semiconductor layer to form a fin structure. The method further includes oxidizing the semiconductor interlayer.

20 Claims, 24 Drawing Sheets

(51) Int. Cl.
  *H01L 27/092*   (2006.01)
  *H01L 29/786*   (2006.01)
  *H01L 21/306*   (2006.01)
  *H01L 21/02*    (2006.01)
  *H01L 21/8252*  (2006.01)
  *H01L 29/78*    (2006.01)

(52) U.S. Cl.
  CPC ......... *H01L 21/823487* (2013.01); *H01L 29/66666* (2013.01); *H01L 29/7827* (2013.01)

(56) References Cited

U.S. PATENT DOCUMENTS

| | | | |
|---|---|---|---|
| 9,799,647 | B1 | 10/2017 | Cheng et al. |
| 2004/0175848 | A1* | 9/2004 | Chen ............... B82Y 10/00 438/3 |
| 2006/0175660 | A1 | 8/2006 | Cheng et al. |
| 2009/0045450 | A1* | 2/2009 | Koo ............... H01L 29/7881 257/316 |
| 2010/0176470 | A1* | 7/2010 | Horng ............... H01L 43/08 257/421 |
| 2013/0264544 | A1 | 10/2013 | Karg et al. |
| 2014/0042382 | A1 | 2/2014 | Lung |
| 2014/0264558 | A1 | 9/2014 | Chandra et al. |
| 2016/0240665 | A1 | 8/2016 | Chen et al. |
| 2016/0268256 | A1 | 9/2016 | Yang et al. |
| 2017/0084829 | A1* | 3/2017 | Lee ............... G11C 11/161 |
| 2017/0186866 | A1 | 6/2017 | Einav |
| 2018/0012659 | A1 | 1/2018 | Biswas et al. |
| 2019/0123262 | A1* | 4/2019 | Lee ............... H01L 43/12 |
| 2019/0198509 | A1* | 6/2019 | Kim ............... H01L 27/11565 |

OTHER PUBLICATIONS

Weijie Chen et al., "GaN nanowire fabricated by selective wet-etching of GaN micro truncated-pyramid" Journal of Crystal Growth 426, (2015) 168-172.

Wenjun Li et al., "Polarization-Engineered III-Nitride Heterojunction Tunnel Field-Effect Transistors," IEEE Journal on Exploratory Solid-State Computational Devices and Circuits, vol. 1, 2015.

Yoshio Honda et al., "Growth of (1 % 1 0 1) GaN on a 7-degree off-oriented (0 0 1)Si substrate by selective MOVPE," Journal of Crystal Growth 242, (2002) 82-86.

* cited by examiner

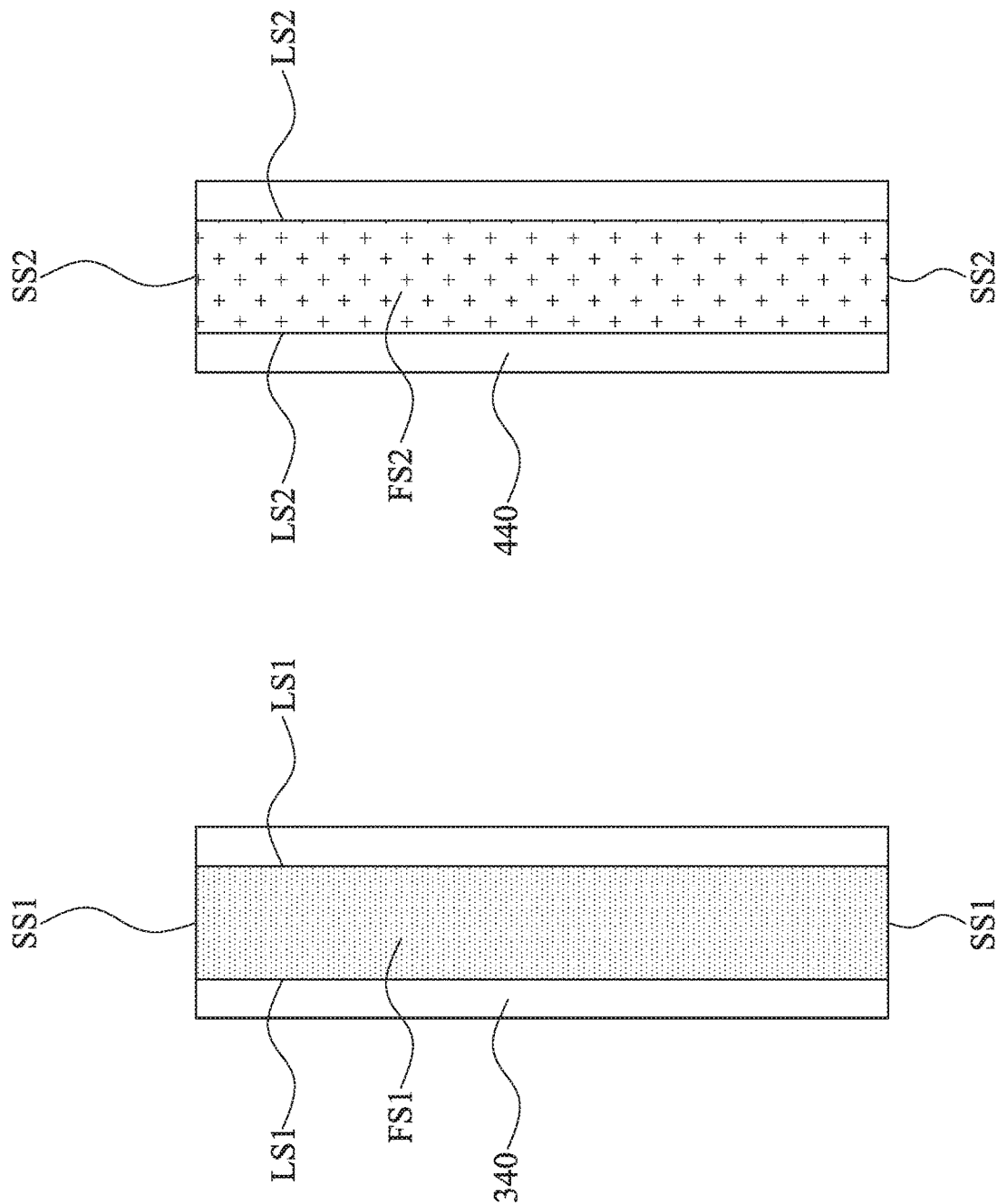

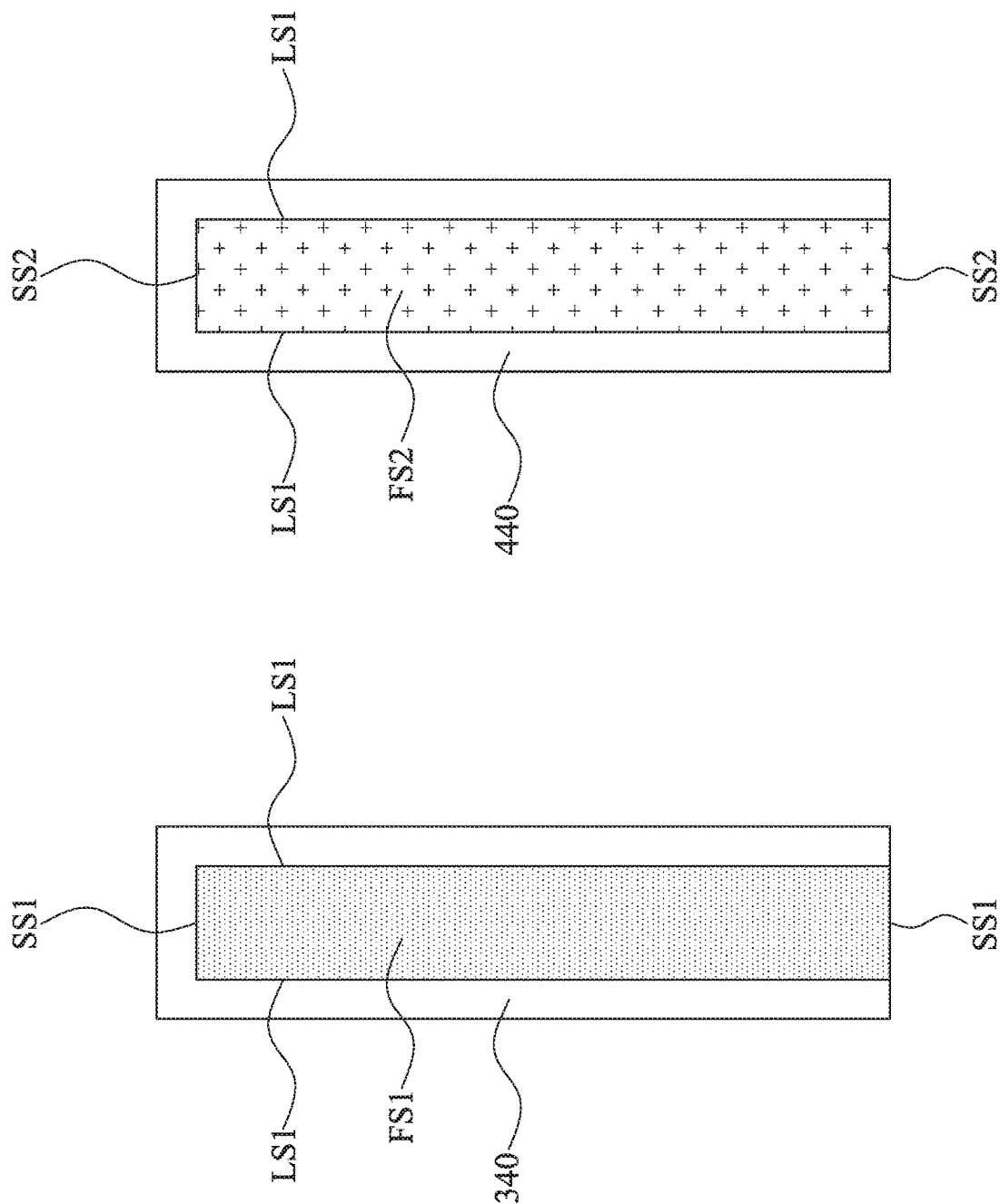

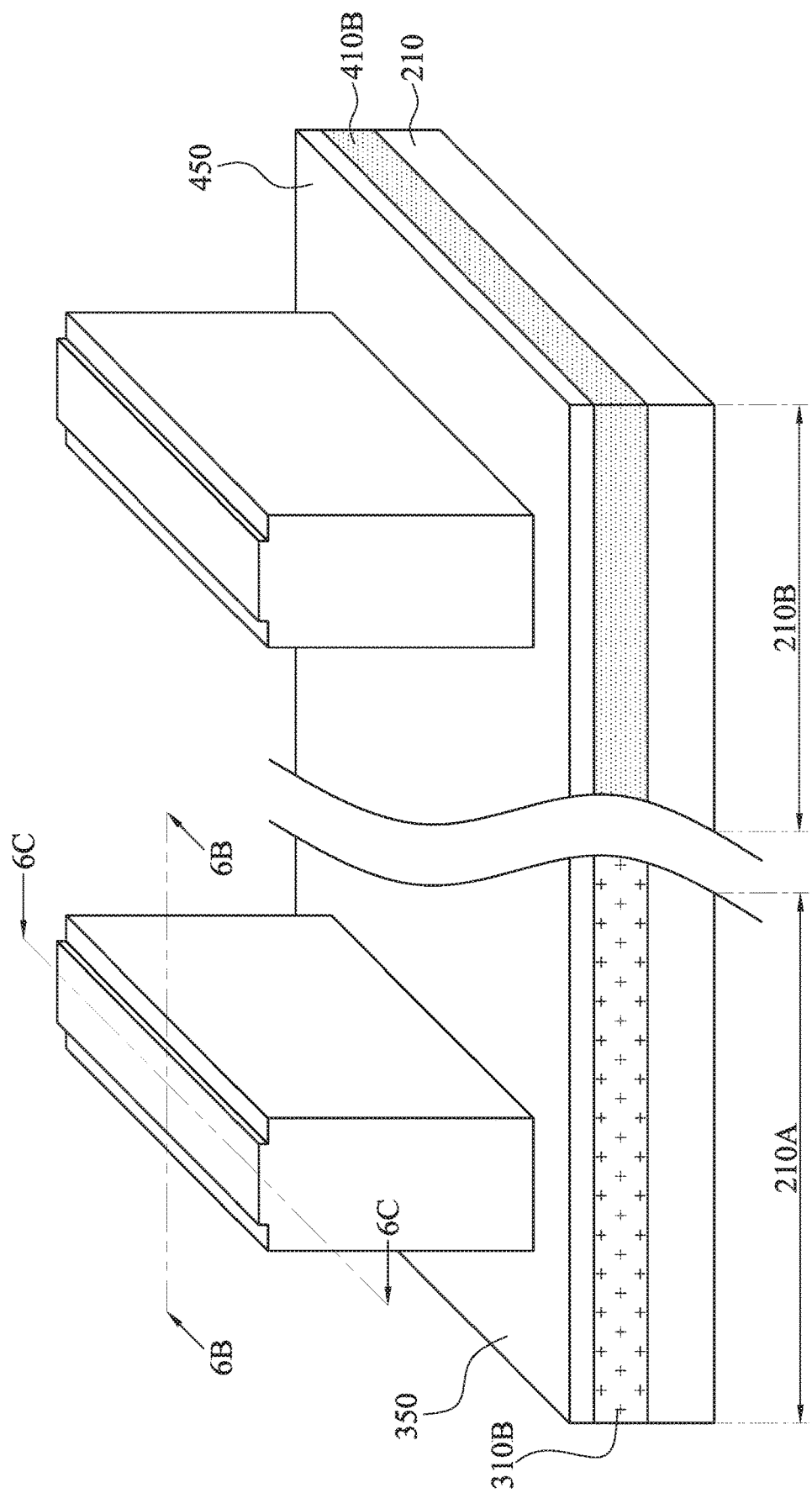

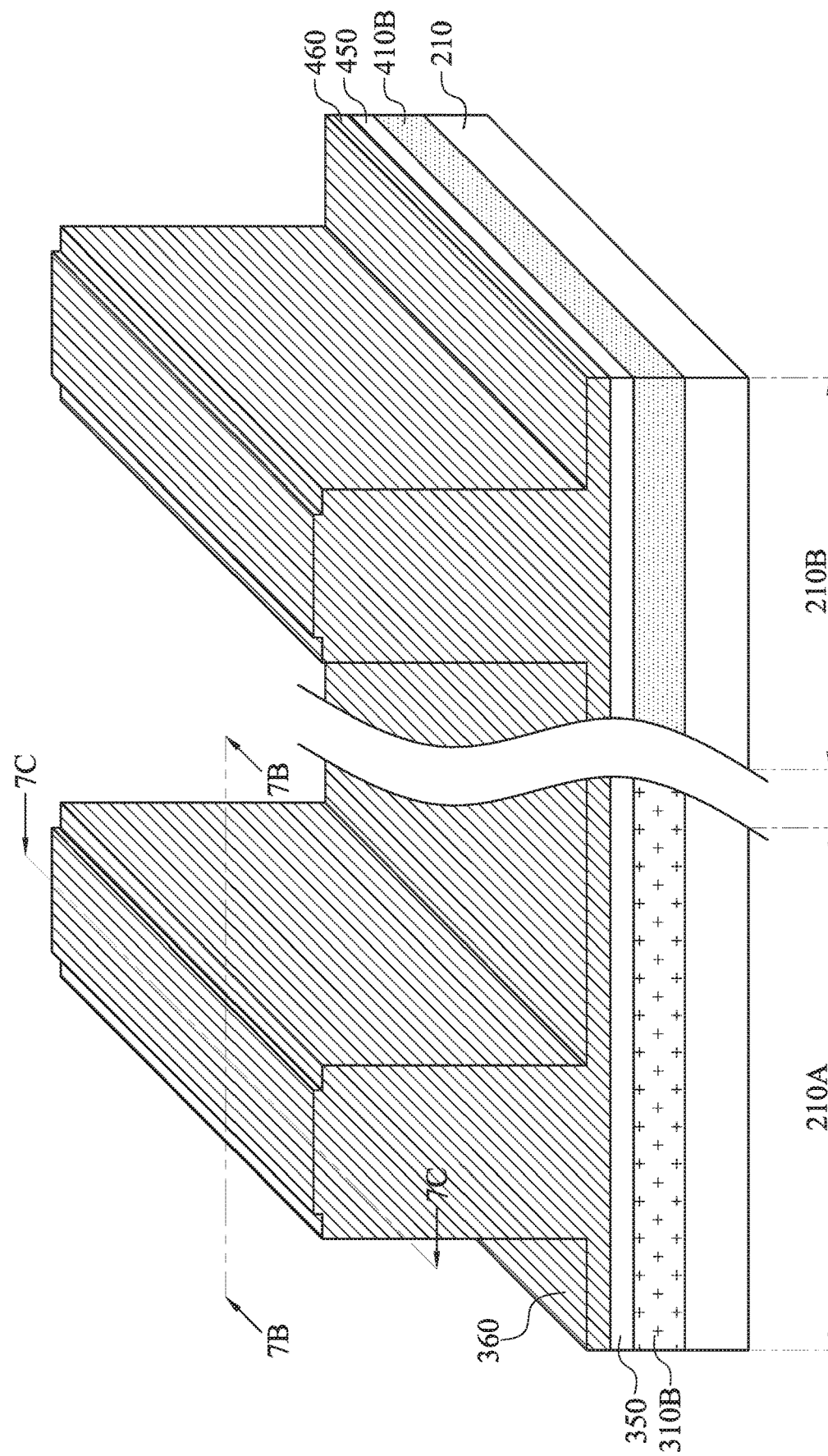

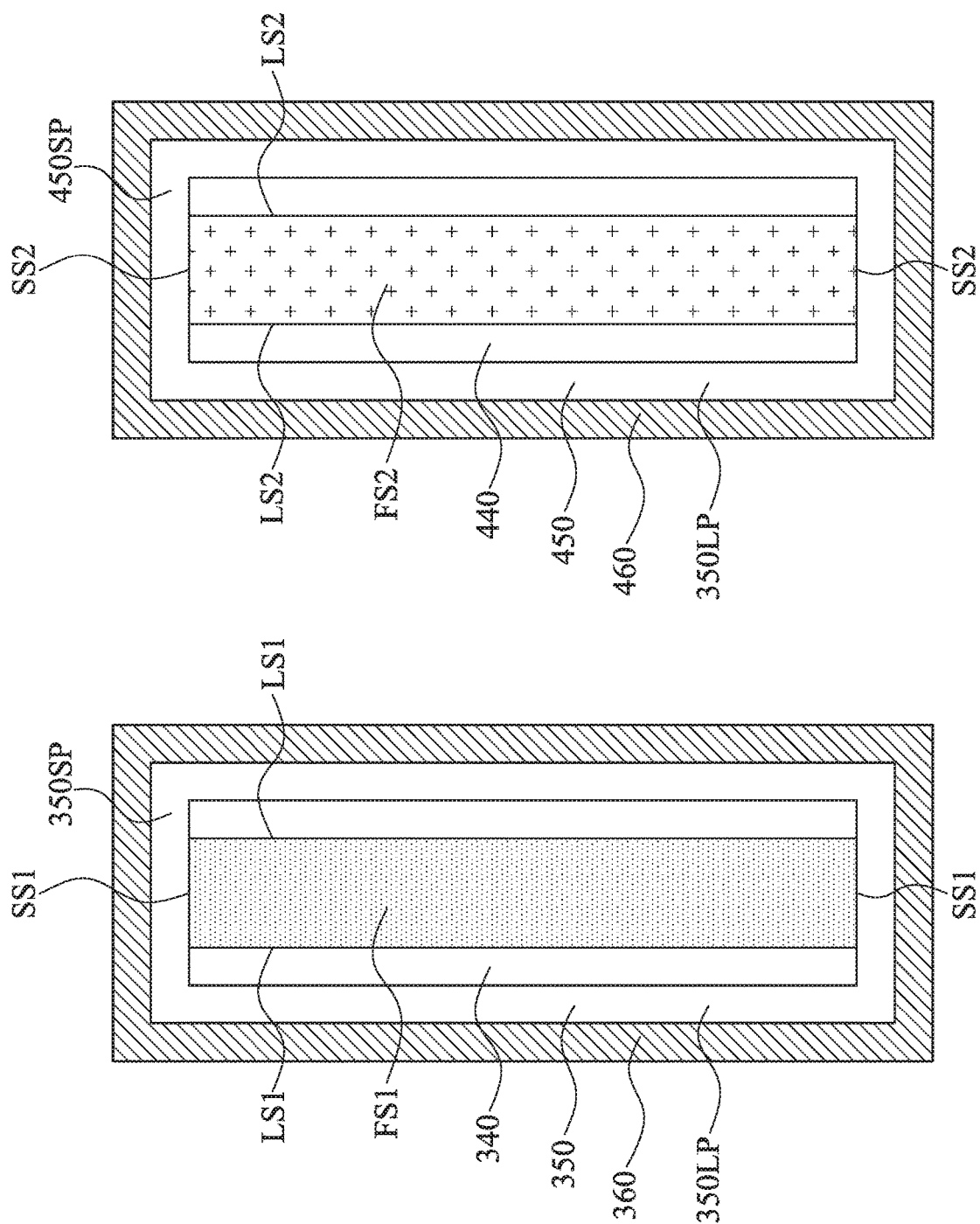

METHOD FOR FORMING SEMICONDUCTOR STRUCTURE

CROSS REFERENCE TO RELATED APPLICATIONS

This application is a Divisional application of U.S. patent application Ser. No. 16/053,617, filed on Aug. 2, 2018, the entire of which is incorporated by reference herein.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. Field effect transistors (FETs) are widely used in integrated chips. FETs comprise a source, a drain, and a gate. A large subthreshold slope (i.e., a small subthreshold swing) is typically desired since it improves the ratio between on and off currents, and therefore reduces leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
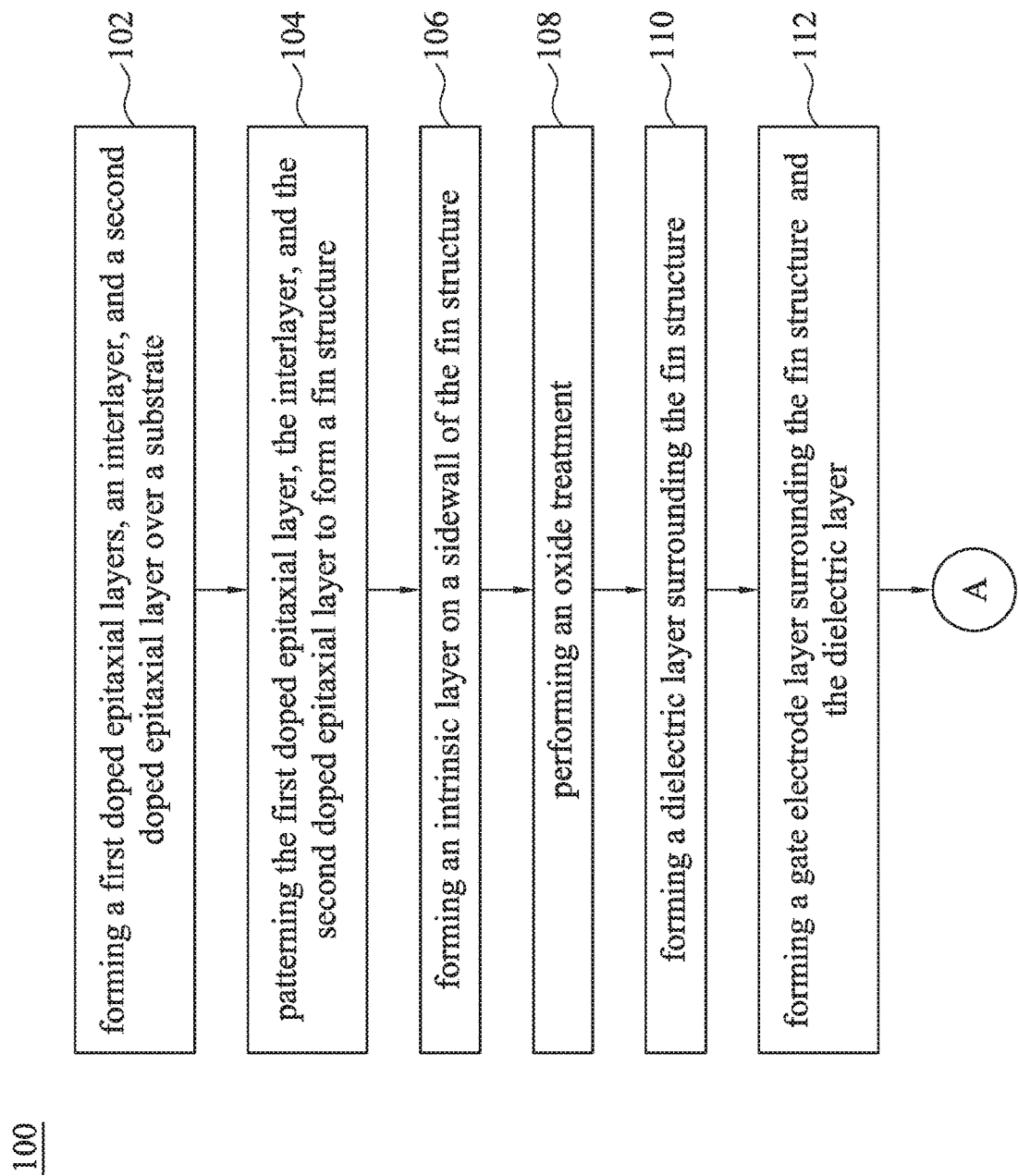
FIGS. 1A and 1B are flow charts of a method of forming a tunnel field-effect transistor (TFET) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A parameter known as sub-threshold swing (SS) represents the easiness of switching the transistor current off, and is a factor in determining the speed of a transistor. In an existing field, the sub-threshold swing (SS) has a limit of about 60 mV/decade at room temperature. This limitation is because the diffusion transport mechanism of carriers is affected by temperature. For this reason, existing devices cannot switch faster than 60 mV/decade at room temperature.

Tunnel Field-Effect Transistors (TFETs) have been explored to address the above-discussed problem. In a TFET, injection is governed by the band-to-band tunneling from the valence band of the source to the conduction band of the channel. Since the current mechanism is tunneling determined, the current shows very weak temperature dependence, arising mainly due to band-gap changes with temperature. Accordingly, the SS is not limited by the temperature, and much lower SS can be achieved.

Figure 1B:
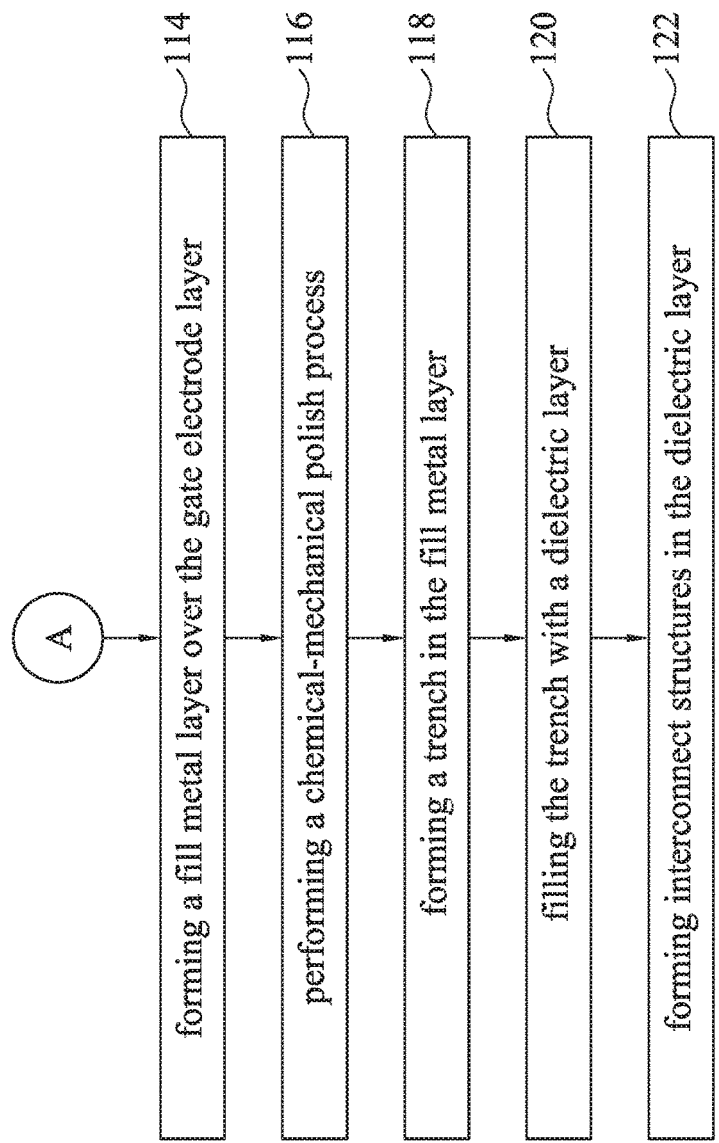

FIGS. 1A and 1B are flow charts of a method 100 of forming TFETs in accordance with some embodiments of the present disclosure. FIGS. 2-12B illustrate a method 100 for forming TFETs at various stages in accordance with some embodiments of the present disclosure. The illustration is merely exemplary and is not intended to be limiting beyond what is specifically recited in the claims that follow. It is understood that additional operations may be provided before, during, and after the operations shown by FIGS. 1A and 1B, and some of the operations described below can be replaced or eliminated for additional embodiments of the method. The order of the operations/processes may be interchangeable.

Figure 2:
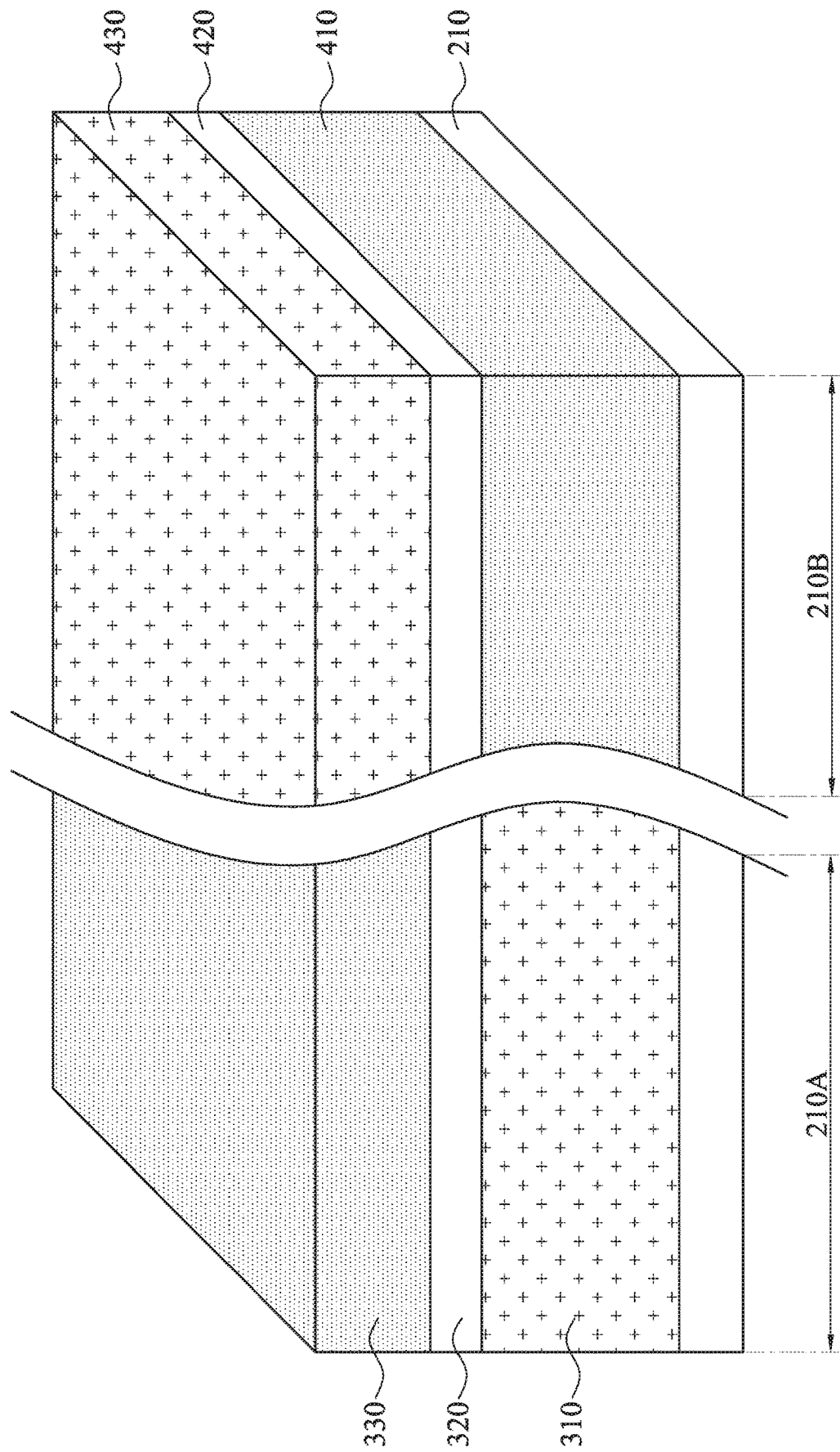
FIGS. 2-12B illustrating a method for forming a TFET at various stages in accordance with some embodiments of the present disclosure.

Referring to FIG. 2, the method 100 begins at operation 102 where a first doped epitaxial layer 310, an interlayer 320, and a second doped epitaxial layer 330 are formed over a first region 210A of a substrate 210, and a first doped epitaxial layer 410, an interlayer 420, and a second doped epitaxial layer 430 are formed over a second region 210B of the substrate 210. The first region 210A may be for forming n-type devices, such as n-type TFETs, and the second region 210B may be for forming p-type devices, such as p-type TFETs.

The substrate 210 may be a semiconductor substrate, such as a bulk semiconductor, a semiconductor-on-insulator (SOI) substrate, or the like. The substrate 210 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the first doped epitaxial layer 310 and 410 and the second doped epitaxial layers 330 and 430 are formed of low-bandgap materials, which may be low-bandgap III-V compound semiconductor materials. The low-bandgap materials may have bandgaps lower than about 0.75 eV, or lower than about 0.5 eV, for example. For example, the first doped epitaxial layers 310 and 410 and the second doped epitaxial layers 330 and 430 are made of $Ga_xIn_{1-x}As_ySb_{1-y}$, wherein "x" is in a range from about 0 to about 1, and "y" is in a range from about 0 to about 1.

In some embodiments, the first doped epitaxial layer 310 and second doped epitaxial layer 330 are different in composition and/or material. For example, the "x" and "y" in the first doped epitaxial layer 310 are different from that in the second doped epitaxial layer 330. In further embodiments, the first doped epitaxial layer 310 may be made of aluminum-free InAs, while the second doped epitaxial layer 330 may be made of aluminum-free GaSb. The absence of aluminum from epitaxial layers 310 and 330 will result in reduction of oxidized epitaxial layers 310 and 330 after an oxidation process in a later stage. The first and second doped epitaxial layers 310 and 330 are of opposite conductive types. In some embodiments, the first doped epitaxial layer 310 is doped by an n-type dopant, such as, but not limited to, silicon, oxygen, or a combination thereof. The first doped epitaxial layer 310 may have an n-type impurity concentration higher than about $10^{18}/cm^3$. The second doped epitaxial layer 330 is doped by a p-type dopant, such as, but not limited to, magnesium, calcium, zinc, beryllium, carbon, and combinations thereof. The second doped epitaxial layer 330 may have a p-type impurity concentration higher than about $10^{18}/cm^3$. The first doped epitaxial layer 310 and the second doped epitaxial layer 330 are used for an n-type TFET.

The first doped epitaxial layer 410 and second doped epitaxial layer 430 are different in composition and/or material. For example, the "x" and "y" in the first doped epitaxial layer 410 are different from that in the second doped epitaxial layer 430. In certain embodiments, the first doped epitaxial layer 410 may be made of aluminum-free GaSb, while the second doped epitaxial layer 430 may be made of aluminum-free InAs. The absence of aluminum from epitaxial layers 410 and 430 will result in reduction of oxidized epitaxial layers 410 and 430 after an oxidation process in a later stage. The first and second doped epitaxial layers 410 and 430 are of opposite conductive types. In some embodiments, the first doped epitaxial layer 410 is doped by a p-type dopant, such as, but not limited to, magnesium, calcium, zinc, beryllium, carbon, and combinations thereof. The first doped epitaxial layer 410 may have a p-type impurity concentration higher than about $10^{18}/cm^3$. The second doped epitaxial layer 430 is doped by an n-type dopant, such as, but not limited to, silicon, oxygen, or a combination thereof. The second doped epitaxial layer 430 may have an n-type impurity concentration higher than about $10^{18}/cm^3$. The first doped epitaxial layer 410 and the second doped epitaxial layer 430 are used for a p-type TFET.

In some embodiments, the interlayers 320 and 420 are made of an aluminum-containing semiconductor. The material(s) of the interlayers 320 and 420 is different from that of the first doped epitaxial layers 310 and 410 and the second doped epitaxial layers 330 and 430. For example, the interlayers 320 and 420 are $Al_xGa_{1-x}As_ySb_{1-y}$, wherein "x" is in a range from about 0.1 to about 1, and "y" is in a range from about 0 to about 1. The "x" and "y" is chosen so as to be lattice-matched to the overlying and underlying materials, such as the layers 310 and 410 and the layers 330 and 430. In further embodiments, the interlayers 320 and 420 are binary aluminium antimonide (AlSb) compound free from gallium and arsenide.

In some embodiments, the interlayers 320 and 420 are not intentionally doped, for example, not having intentionally placed dopants, but rather having a doping resulting from process contaminants. For example, the interlayers 320 and 420 are free from the dopants in the first doped epitaxial layers 310 and 410, or have lower dopant concentration than that of the first doped epitaxial layers 310 and 410.

In some embodiments, the first doped epitaxial layer 310 and 410, the interlayers 320 and 420, and the second doped epitaxial layers 330 and 430 have the same crystal structure, which is face-centered cubic (FCC), also referred to as Zinc blende. In some embodiments, the substrate 210 has a (001) surface, and thus the growth direction of the first doped epitaxial layers 310 and 410, the interlayers 320 and 420, and the second doped epitaxial layers 330 and 430 over the (001) surface of the substrate 210 is [001]. In some other embodiments, the substrate 210 has a (111) surface, and thus the growth direction of the first doped epitaxial layers 310 and 410, the interlayers 320 and 420, and the second doped epitaxial layers 330 and 430 over the (111) surface of the substrate 210 is [111].

In some embodiments, the first doped epitaxial layer 310 and 410, the interlayers 320 and 420, and the second doped epitaxial layers 330 and 430 may be formed by a suitable deposition process, such as chemical vapor deposition (CVD), low pressure CVD (LPCVD), atmospheric pressure CVD (APCVD), ultrahigh vacuum CVD (UHVCVD), atomic layer deposition (ALD), molecular layer deposition (MLD), plasma enhanced CVD (PECVD), metal-organic CVD (MOCVD), molecular beam epitaxy (MBE), sputter deposition, the like, or combinations thereof. The thickness of the first doped epitaxial layer 310 and 410 and the second doped epitaxial layers 330 and 430 may be greater than 20 nm, so as to be sufficiently thick to provide low dislocation density ($<10^8$ $cm^{-2}$). The interlayers 320 and 420 may respectively have a thickness in a range of 10 nanometers to 20 nanometers, so as to be easily oxidized and thus provide sufficient insulation in a later stage.

Figure 3:
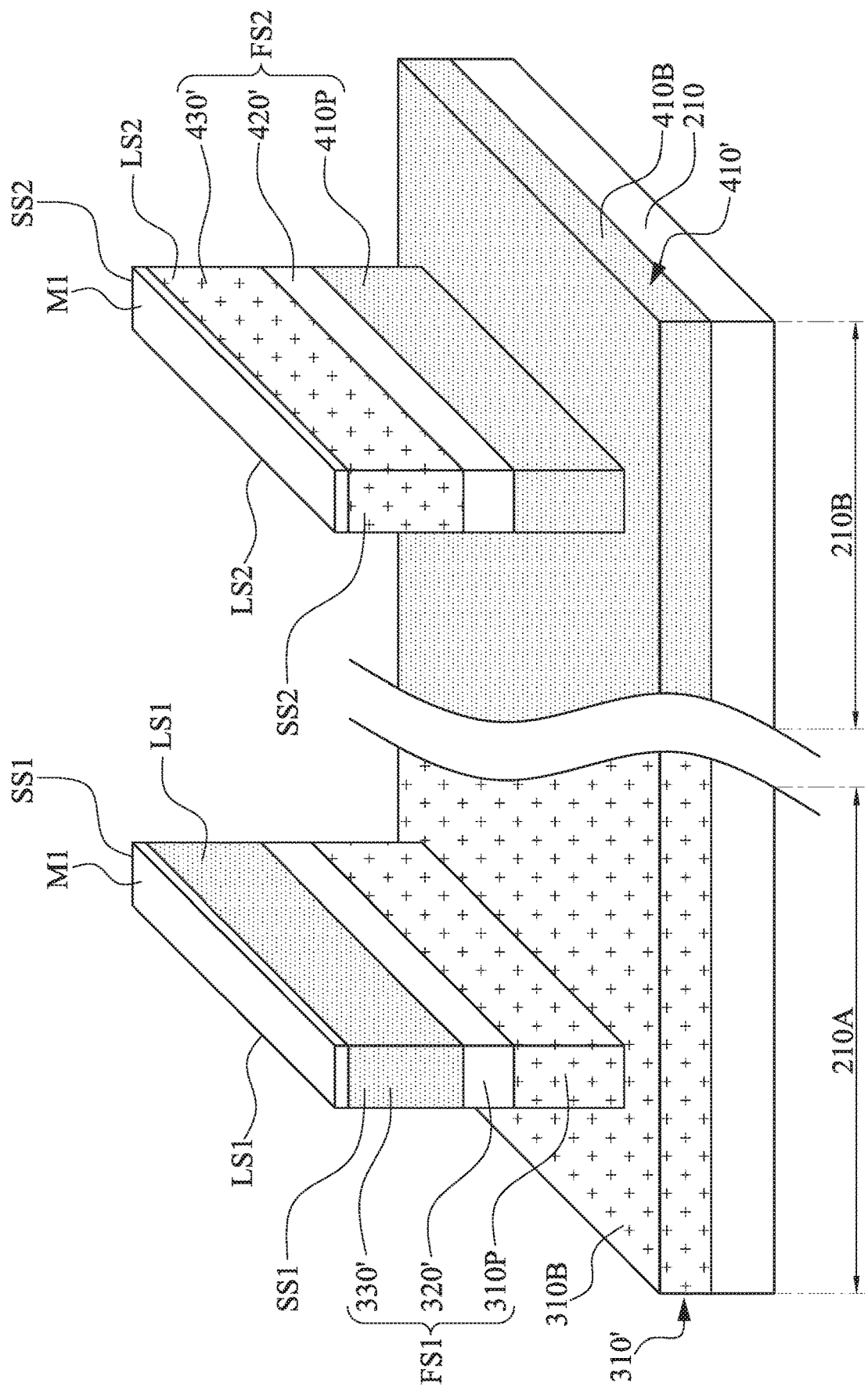

Referring to FIG. 3, the method 100 proceeds to operation 104 where the first doped epitaxial layers 310 and 410, the interlayers 320 and 420, and the second doped epitaxial layers 330 and 430 are patterned to form fin structures FS1 and FS2. In some embodiments, a patterned mask M1 is formed over the second doped epitaxial layers 330 and 430 to define positions where TFETs are to be formed. An etch process is performed to remove portions of the first doped epitaxial layers 310 and 410, the interlayers 320 and 420, and the second doped epitaxial layers 330 and 430 uncovered by the patterned mask M1, such that the fin structures FS1 and FS2 are formed.

Herein, the remaining portions of the first doped epitaxial layers 310 and 410 are referred to as the first doped epitaxial layers 310' and 410', respectively. The first doped epitaxial layers 310' and 410' have bottom portions 310B and 410B and protruding portions 310P and 410P upwardly protruding from the bottom portions 310B and 410B respectively. The remaining portions of the interlayers 320 and 420 are referred to as the interlayers 320' and 420', respectively. The remaining portions of the second doped epitaxial layers 330 and 430 are referred to as the second doped epitaxial layers 330' and 430', respectively. A combination of the protruding portion 310P, the interlayer 320', and the second doped epitaxial layer 330' is referred to as the fin structure FS1. Similarly, a combination of the protruding portion 410P, the interlayer 420', and the second doped epitaxial layer 430' is referred to as the fin structure FS2.

As illustrated, the fin structure FS1 has long sides LS1 and short sides SS1 shorter than the long sides LS1, and the fin structure FS2 has long sides LS2 and short sides SS2 shorter than the long sides LS2. The short sides SS1 connect the opposite long sides LS1, and the short sides SS2 connect the opposite long sides LS2. The long sides LS1 and short sides SS1 may also be referred to as sidewalls in this context. In some embodiments where the substrate 210 has the (001) facet at its top, the patterning can be performed such that long sides LS1 and short sides SS1 of the fin structure FS1 are orientated in different crystal directions. Such different crystal directions may result in a growth rate of III-V compound on the long sides LS1 different from that on the short sides SS1. For example, the long sides LS1 and short sides SS1 of the fin structure FS1 have [110] and [1-10] directions, respectively. For example, in some embodiments, the long sides LS1 extend along the (110) crystal plane, and the short sides SS1 extend along the (1-10) crystal plane. In some other embodiments, the long sides LS1 extend along the (1-10) crystal plane, and the short sides SS1 extend along the (110) crystal plane. Similarly, the patterning is performed such that long sides LS2 and short sides SS2 of the fin structure FS1 are orientated in different crystal directions, such as [110] and [1-10] directions.

In some embodiments where the substrate 210 has the (111) facet at its top, the patterning can be performed such that the fin structures FS1 and FS2 are orientated in different crystal directions. Such different crystal directions may result in a growth rate of III-V compound on the long sides LS1 different from that on the short sides SS1. For example, the long sides LS1 and short sides SS1 of the fin structure FS1 have [−110] and [11-2] directions. For example, in some embodiments, the long sides LS1 extend along the (−110) crystal plane, and the short sides SS1 extend along the (11-2) crystal plane. In some other embodiments, the long sides LS1 extend along the (11-2) crystal plane, and the short sides SS1 extend along the (−110) crystal plane. Similarly, the patterning is performed such that long sides LS2 and short sides SS2 of the fin structure FS1 are orientated in different crystal directions, such as [−110] and [11-2] directions.

Figure 4A:
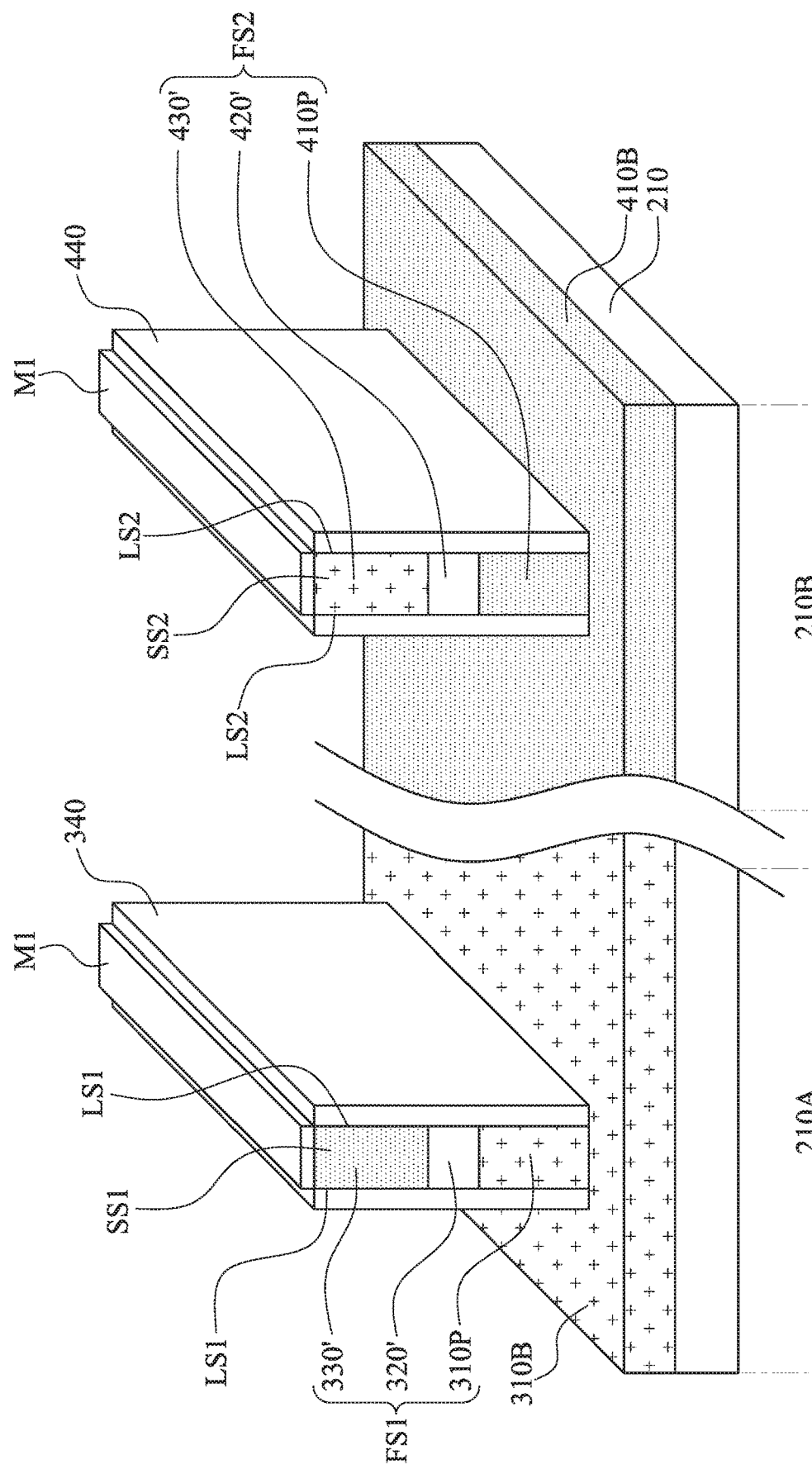

Referring to FIGS. 4A and 4B, the method 100 proceeds to operation 106 where intrinsic semiconductor layers 340 are formed on opposite long sides LS1 of the fin structure FS1, and intrinsic semiconductor layers 440 are formed on opposite long sides LS2 of the fin structure FS2. FIG. 4B is a top view of the structure shown in FIG. 4A, in which some elements (e.g., the patterned mask M1 and the bottom portions 310B and 410B) are omitted. The intrinsic semiconductor layers 340 and 440 are vertical with respect to a horizontal surface of the substrate 210. As shown in FIG. 4B, the long sides LS1 and LS2 of the fin structures FS1 and FS2 are covered by the intrinsic semiconductor layers 340 and 440, respectively, while the short sides SS1 and SS2 of the fin structures FS1 and FS2 are exposed by the intrinsic semiconductor layers 340 and 440.

The intrinsic semiconductor layers 340 and 440 may be formed of low-bandgap III-V semiconductors with a Zinc blende crystal structure. For example, the intrinsic semiconductor layers 340 and 440 may be made of $Ga_xIn_{1-x}As_ySb_{1-y}$ wherein "x" is in a range from about 0 to about 1, and "y" is in a range from about 0 to about 1. The intrinsic semiconductor layers 340 and 440 may be made of the same material as that of the drain layers of TFET, such as first doped epitaxial layers 310' and 410', respectively. For example, in some embodiment, the intrinsic semiconductor layer 340 may be NID InAs layer connecting the n-doped InAs layer 310' and GaSb layer 330' of an n-type TFET. In some embodiment, the intrinsic semiconductor layer 440 may be a GaSb layer connecting the GaSb layer 410' and InAs layer 430' of a p-type TFET. It should not limit the scope of the present embodiments. Herein, a thickness of the intrinsic semiconductor layers 340 and 440 may be in a range of 1 to 6 nanometers, for example, 3 nanometers. The thickness of the intrinsic semiconductor layers 340 and 440 is chosen to enlarge the active area and optimize the tunneling effect. In some embodiments, the intrinsic semiconductor layers 340 and 440 are not intentionally doped, for example, not having intentionally placed dopants, but rather having a doping resulting from process contaminants. For example, the intrinsic semiconductor layers 340 and 440 are not intentional doped (NID) semiconductor layers and thus free from the dopants in the first doped epitaxial layers 310 and 410 and the second doped epitaxial layers 330 and 430. Alternatively, intrinsic semiconductor layers 340 and 440 may be doped with a p-type or an n-type, and with a doping concentration lower than that of first doped epitaxial layers 310 and 410 and the second doped epitaxial layers 330 and 430. For example, the intrinsic semiconductor layers 340 and 440 have dopant concentration lower than about $10^{13}/cm^3$.

In some embodiments, the formation of the intrinsic semiconductor layers 340 and 440 may rely on different growth rates on different crystal plane. For example, in some embodiments, the intrinsic semiconductor layer has a different growth rate on the long sides LS1 and LS2 than that on the short sides SS1 and SS2, and thereby the intrinsic semiconductor layer on the long sides LS1 and LS2 may be thicker than the intrinsic semiconductor layer on the short sides SS1 and SS2. In certain embodiments, the intrinsic semiconductor layer may not grow on the short sides SS1 and SS2 of the fin structures FS1 and FS2, but grow on long sides LS1 and LS2 of the fin structures FS1 and FS2. As a result, the short sides SS1 and SS2 of the fin structures FS1 and FS2 are free from coverage by the intrinsic semiconductor layers 340 and 440 and thus exposed to facilitate a subsequent oxidation process.

In some embodiments, the formation of the intrinsic semiconductor layers 340 and 440 may rely on different etching rates at different crystal plane. For example, the intrinsic semiconductor layer has a different etching rate on the short sides SS1 and SS2 than that on the long sides LS1 and LS2. For example, the intrinsic semiconductor layer on the long sides LS1 and LS2 of the fin structures FS1 and FS2 have higher etch resistance than that of the intrinsic semiconductor layer on the short sides SS1 and SS2 of the fin structures FS1 and FS2, such that the intrinsic semiconductor layer on the short sides SS1 and SS2 can be removed by an etching process, while the intrinsic semiconductor layer on the long sides LS1 and LS2 (referred to as the intrinsic semiconductor layers 340 and 440) remains.

In some other embodiments where the intrinsic semiconductor layer is formed on long sides LS1 and LS and short sides SS1 and SS2, the fin structures FS1 and FS2 and the intrinsic semiconductor layer on the long sides LS1 and LS2 of the fin structures FS1 and FS2 are masked, and an etching process is performed to remove unmasked portions of the intrinsic semiconductor layer. Therefore, the unmasked portions of the intrinsic semiconductor layer (e.g., the intrinsic semiconductor layer on the short sides SS1 and SS2) are removed, while the intrinsic semiconductor layer on the long sides LS1 and LS2 (referred to as the intrinsic semiconductor layers 340 and 440) remains. In some other embodiments, a digital etching is performed to remove the intrinsic semiconductor layer at short sides SS1 and SS2. The digital etching is a cyclic process including at least one repetition of an oxidation step and an etching step to remove the oxidized layer. Each etch step may remove, for example, about 2 nm thickness.

The intrinsic semiconductor layers 340 and 440 may be formed by depositing an intrinsic semiconductor layer and optionally etching the intrinsic semiconductor layer, so as to expose the short sides SS1 and SS2 of the fin structures FS1 and FS2. In some embodiments, the intrinsic semiconductor layers 340 and 440 may be formed by a suitable deposition process, such as chemical vapor deposition (CVD), low pressure CVD (LPCVD), atmospheric pressure CVD (APCVD), ultrahigh vacuum CVD (UHVCVD), atomic layer deposition (ALD), molecular layer deposition (MLD), plasma enhanced CVD (PECVD), metal-organic CVD (MOCVD), molecular beam epitaxy (MBE), sputter deposition, the like, or combinations thereof.

FIG. 4C illustrates an intermediate structure of TFET according to some embodiments of the present disclosure. In the present embodiments, in addition to covering long sides LS1 of the fin structure FS1, the intrinsic semiconductor layer 340 may further cover one short side SS1, and expose another short side SS1 to facilitate a subsequent oxidation process. Similarly, in addition to covering long sides LS2 of the fin structure FS2, the intrinsic semiconductor layer 440 may further cover one short side SS2, and expose another short side SS2 to facilitate a subsequent oxidation process.

Figure 5:
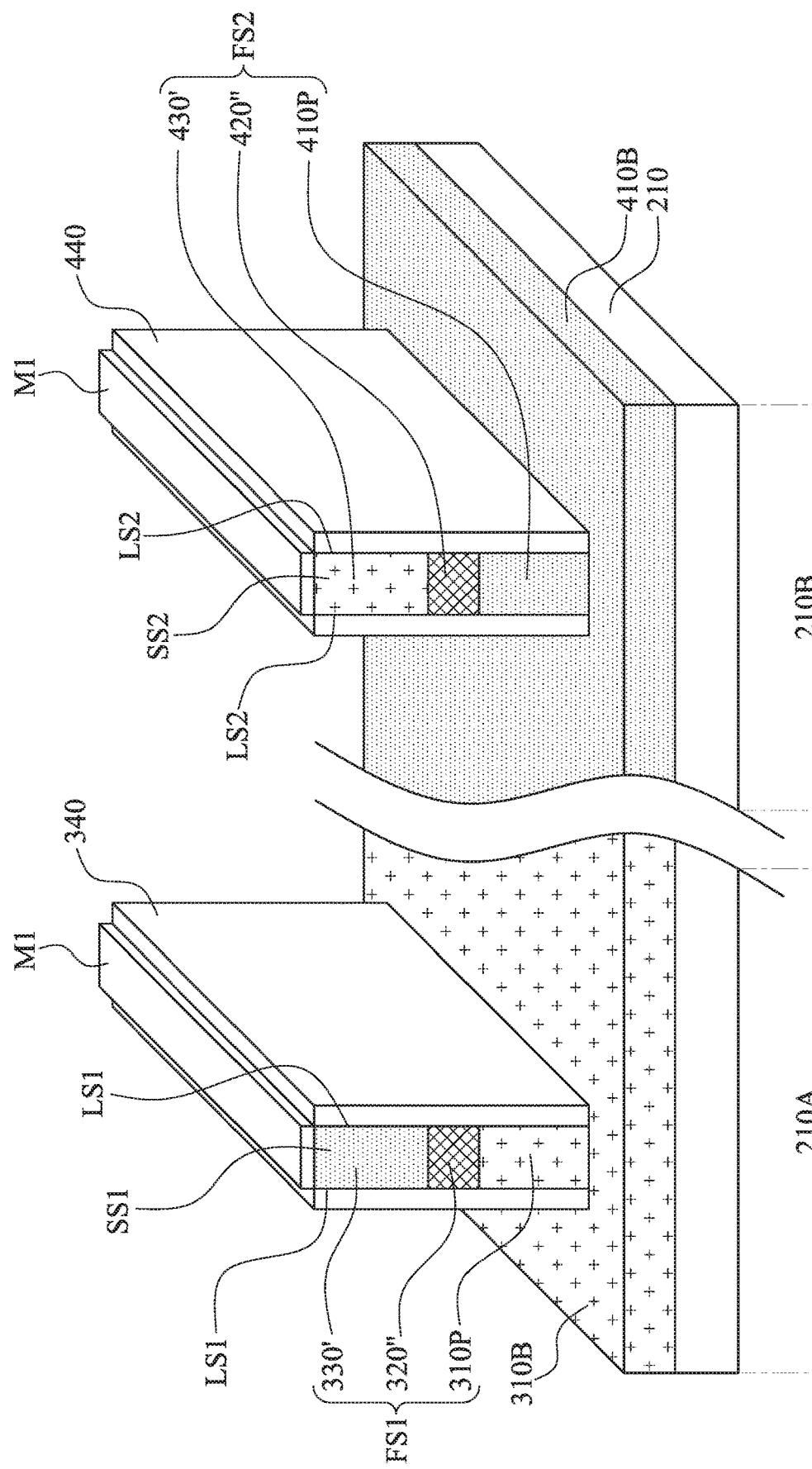

Referring to FIG. 5, the method 100 proceeds to operation 108 where an oxide treatment or process is performed after the formation of the intrinsic semiconductor layers 340 and 440. The oxide treatment may use a gas of $O_2$, $O_3$, or $H_2O$, or oxygen plasma. Through the oxide treatment, oxygen permeates the exposed surfaces of the interlayers 320' and 420', and the interlayers 320' and 420' are oxidized into insulation layers 320" and 420". For example, aluminum-containing semiconductor (e.g., AlSb) can be oxidized, which in turn results in aluminum oxide ($AlO_x$), which is amorphous rather than crystalline. In some embodiments, the interlayers 320' and 420' have higher oxidation rates than that of the layers 310', 330', 340, 410', 430', and 440, such that the interlayers 320' and 420' are oxidized into insulators while the layers 310', 330', 340, 410', 430', and 440 do not. The insulation layers 320" and 420" are insulators with larger band gaps than the aluminum-containing semiconductor (e.g., AlSb) in nature, and thus the insulation layers 320" and 420" can reduce an off-state current compared to the aluminum-containing semiconductor interlayers 320' and 420', and thus leakage currents of the TFETs can be suppressed. After the oxidation, a surface treatment may be optionally performed to the semiconductors (e.g., InAs 310P, GaSb 330', GaSb 410P and InAs 430') to lower the interface trap density (Dit).

Figure 6B:
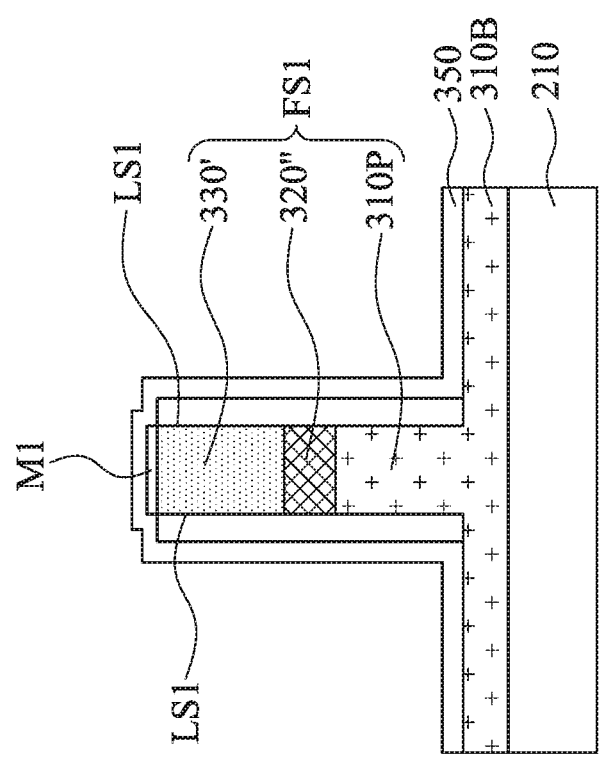
Figure 6C:
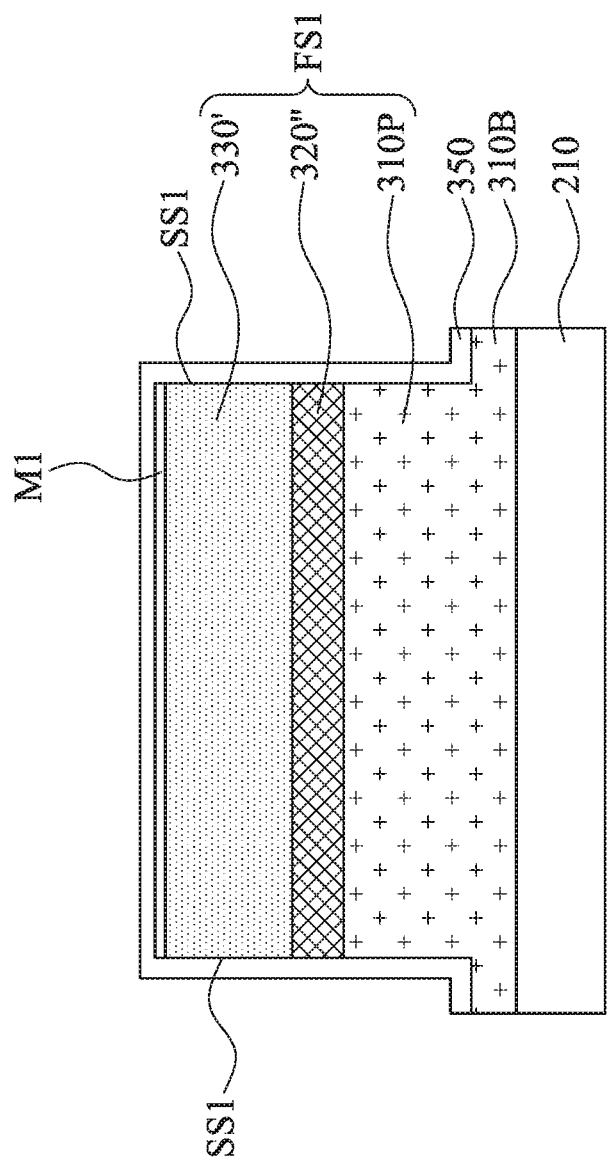

Referring to FIGS. 6A-6C, the method 100 proceeds to operation 110 where gate dielectric layers 350 and 450 are formed surrounding the fin structures FS1 and FS2, respectively. FIG. 6B is a cross-sectional view taken along line 6B-6B of FIG. 6A. FIG. 6C is a cross-sectional view taken along line 6C-6C of FIG. 6A. The gate dielectric layers 350 and 450 are formed by atomic layer deposition (ALD), chemical vapor deposition (CVD), metal organic CVD (MOCVD), physical vapor deposition (PVD), thermal oxidation, or combinations thereof. The gate dielectric layers 350 and 450 are, for example, a binary or ternary high-k film, such as HfO, LaO, AlO, ZrO, TiO, $Ta_2O_5$, $Y_2O_3$, STO, BTO, BaZrO, HfZrO, HfLaO, HfTaO, HfTiO, the like, or combinations thereof. In some embodiments, the gate dielectric layers 350 and 450 are formed of the same material. Alternatively, the gate dielectric layers 350 and 450 are formed of different materials. In some embodiments, a thickness of the gate dielectric layers 350 or 450 may be in a range from about 1 nm to about 10 nm, for example, about 2 nm. In some embodiments, the gate dielectric layer is a multi-layered structure having a high-k dielectric layer and a high temperature oxide (HTO) layer under the high-k dielectric layer. The HTO layer will contribute to reduction of the interfacial density of states (Dit) between the gate dielectric and the semiconductor of the fin structures.

Herein, since the short sides SS1 of the fin structure FS1 are free from coverage by the intrinsic semiconductor layer 340, the resulting gate dielectric layer 350 surrounding the fin structure FS1 can be in contact with the short sides SS1. The configuration of the fin structure FS2 is similar to the fin structure FS1, and therefore not repeated herein.

Figure 7B:
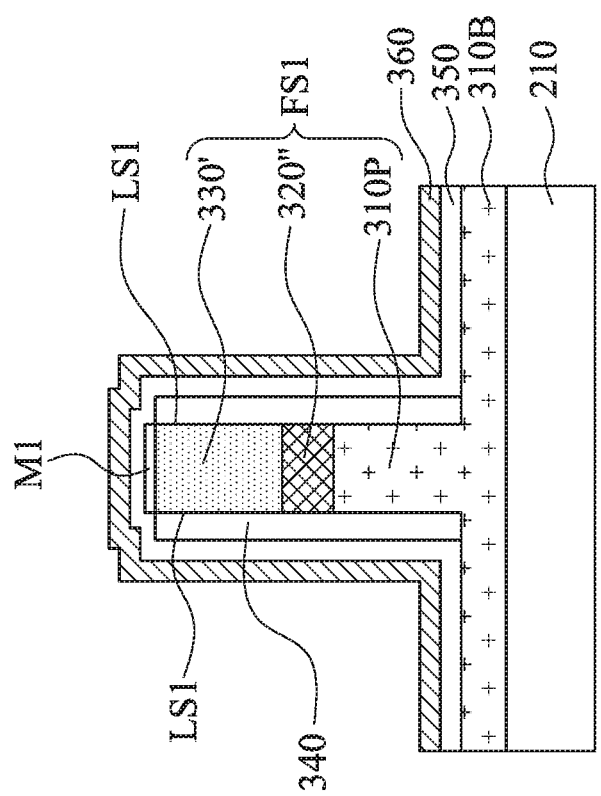
Figure 7C:
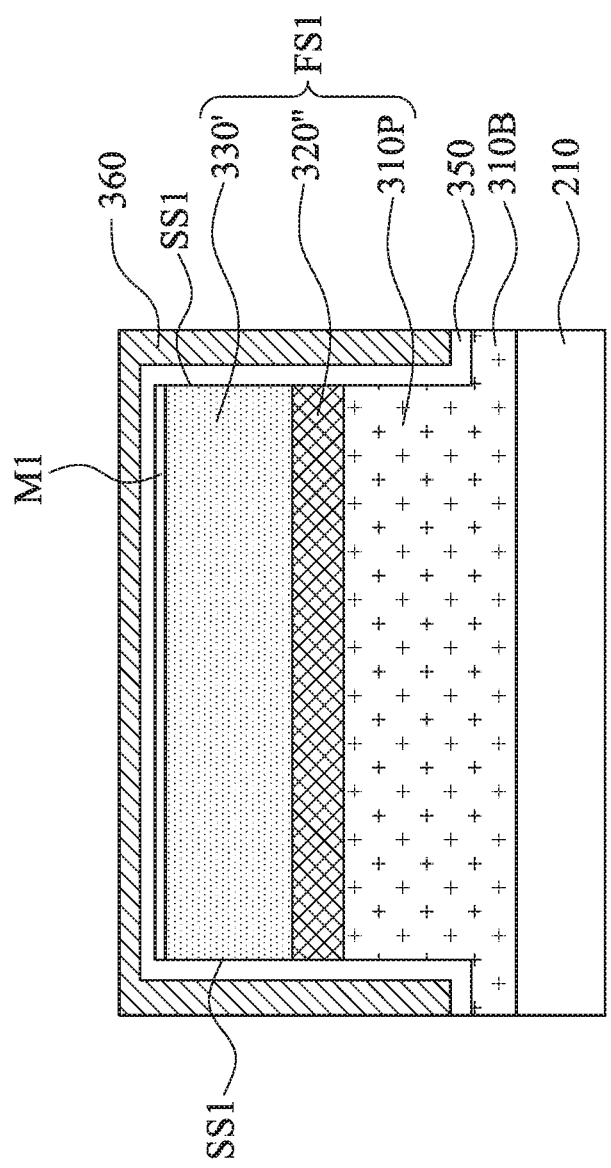

Referring to FIGS. 7A-7C, the method 100 proceeds to operation 112 where a metal gate layer 360 is formed surrounding the fin structure FS1 and the dielectric layer 350, and a metal gate layer 460 is formed surrounding the fin structure FS2 and the dielectric layer 450. FIG. 7B is a cross-sectional view taken along line 7B-7B of FIG. 7A. FIG. 7C is a cross-sectional view taken along line 7C-7C of FIG. 7A. In some embodiments, the metal gate layer 360 is blanket formed over the gate dielectric layer 350 over the first region 210A for forming an n-type TFET. The metal gate layer 460 is blanket formed over the dielectric layer 450 over the second region 210B for forming a p-type TFET. The metal gate layers 360 and 460 may include different work function metals to provide suitable work functions for the n-type and p-type TFETs, respectively. Example materials of the metal gate layers 360 and 460 include tungsten, titanium nitride, the like or combinations thereof. The metal gate layers 360 and 460 are deposited by ALD, sputter or other processes. In some embodiments, a thickness of the metal gate layers 360 and 460 may be in a range from about 1 nm to about 5 nm, for example, about 2 nm.

FIG. 7D is a top view of the structure shown in FIG. 7A. The metal gate layer 360 surrounds the long sides LS1 and the short sides SS1 of the fin structure FS1. The configuration of the fin structure FS2 is similar to the fin structure FS1. For example, the metal gate layer 460 surrounds the long sides LS2 and the short sides SS2 of the fin structure FS1. In certain embodiments where the short sides SS1 of the fin structure FS1 are free from coverage by the intrinsic semiconductor layer 340, the gate dielectric layer 350 includes short portions 350SP each having opposite sides in contact with the short side SS1 of the fin structure FS1 and the metal gate layer 360, respectively. On the contrary, the gate dielectric layer 350 includes long portions 350LP each having opposite sides in contact with the intrinsic semiconductor layer 340 and the metal gate layer 360, respectively. Similarly, the gate dielectric layer 450 includes short portions 450SP each having opposite sides in contact with the short side SS2 of the fin structure FS1 and the metal gate layer 460, respectively. On the contrary, the gate dielectric layer 450 includes long portions 450LP each having opposite sides in contact with the intrinsic semiconductor layer 440 and the metal gate layer 460, respectively.

Figure 7E:
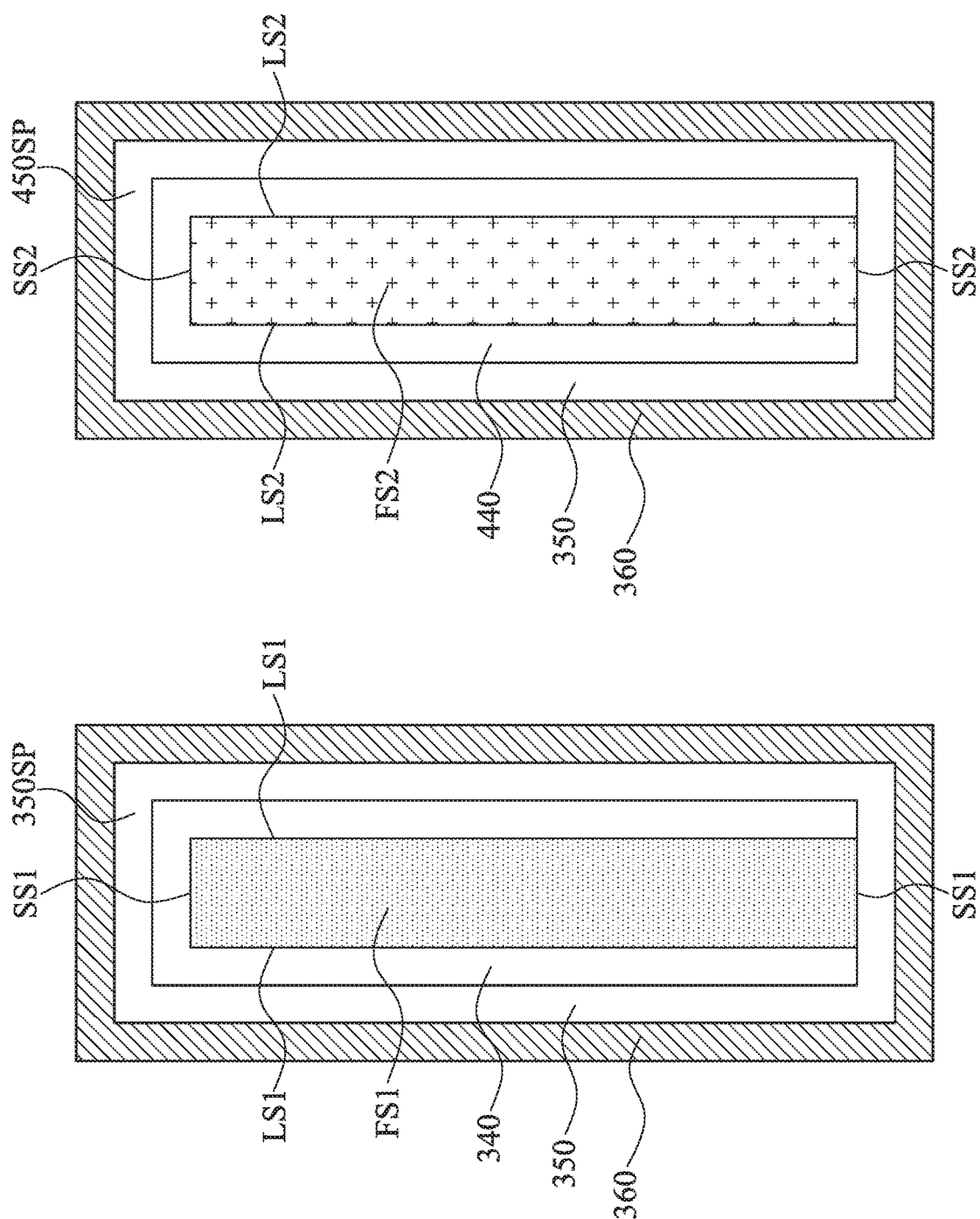

FIG. 7E illustrates an intermediate structure of TFET according to some embodiments of the present disclosure. The embodiments shown in FIG. 7E is similar to that shown in FIG. 7D except that short portions 350SP and 450SP of the gate dielectric layers 350 and 450 are respectively in contact with the intrinsic semiconductor layers 340 and 440, as illustrated in FIG. 7E. In the illustrated embodiments, an upper one of short portions 350SP of the gate dielectric layer 350 is in contact with the intrinsic semiconductor layer 340 rather than an upper short side SS1 of the fin structure FS1, while a lower one of short portions 350SP of the gate dielectric layer 350 is in contact with a lower short side SS1 of the fin structure FS1. Similarly, an upper one of short portions 450SP of the gate dielectric layer 450 is in contact with the intrinsic semiconductor layer 440 rather than an upper short side SS2 of the fin structure FS2, while a lower one of short portions 450SP of the gate dielectric layer 450 is in contact with a lower short side SS2 of the fin structure FS2.

Figure 8:
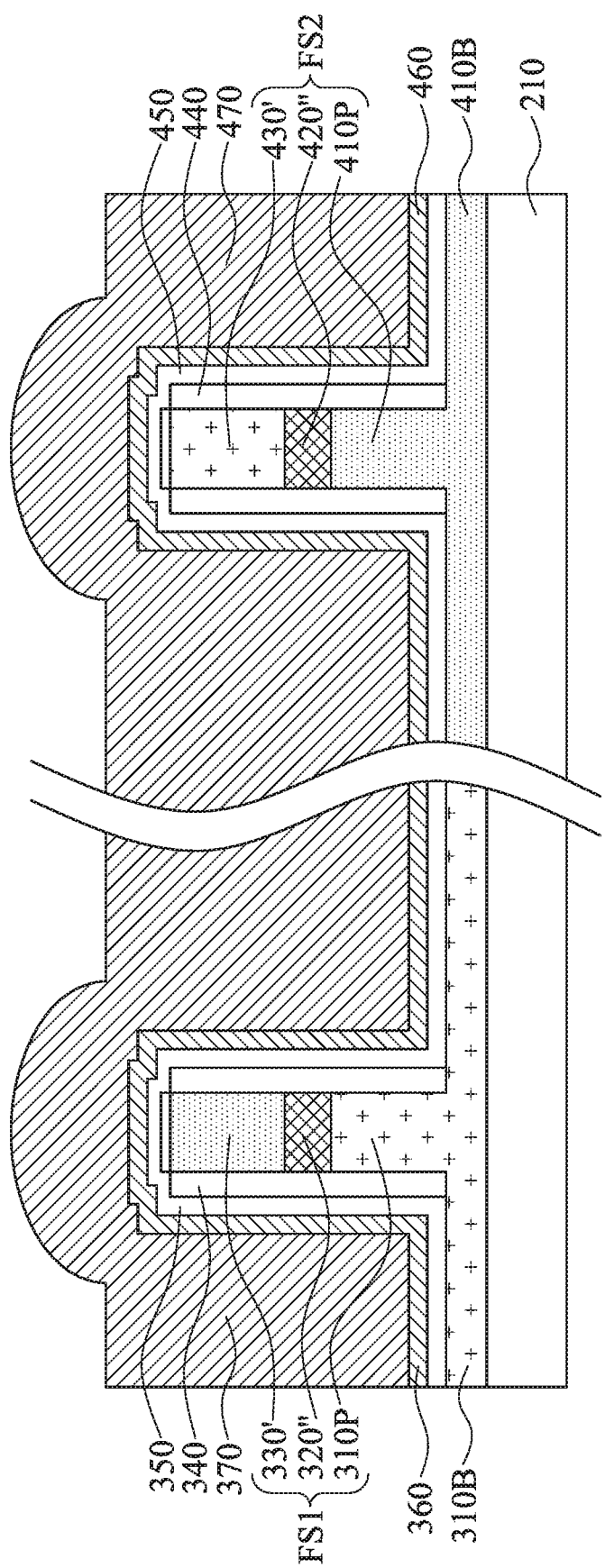

Referring to FIG. 8, the method 100 proceeds to operation 114 where fill metal layers 370 and 470 are formed over the metal gate layers 360 and 460 respectively. The fill metal layers 370 and 470 can be formed by, for example, W, Co, Al, Cu, the like, or combinations thereof. In some embodiments, the fill metal layers 370 and 470 are formed of the same material. Alternatively, the fill metal layers 370 and 470 are formed of different materials.

Figure 9:
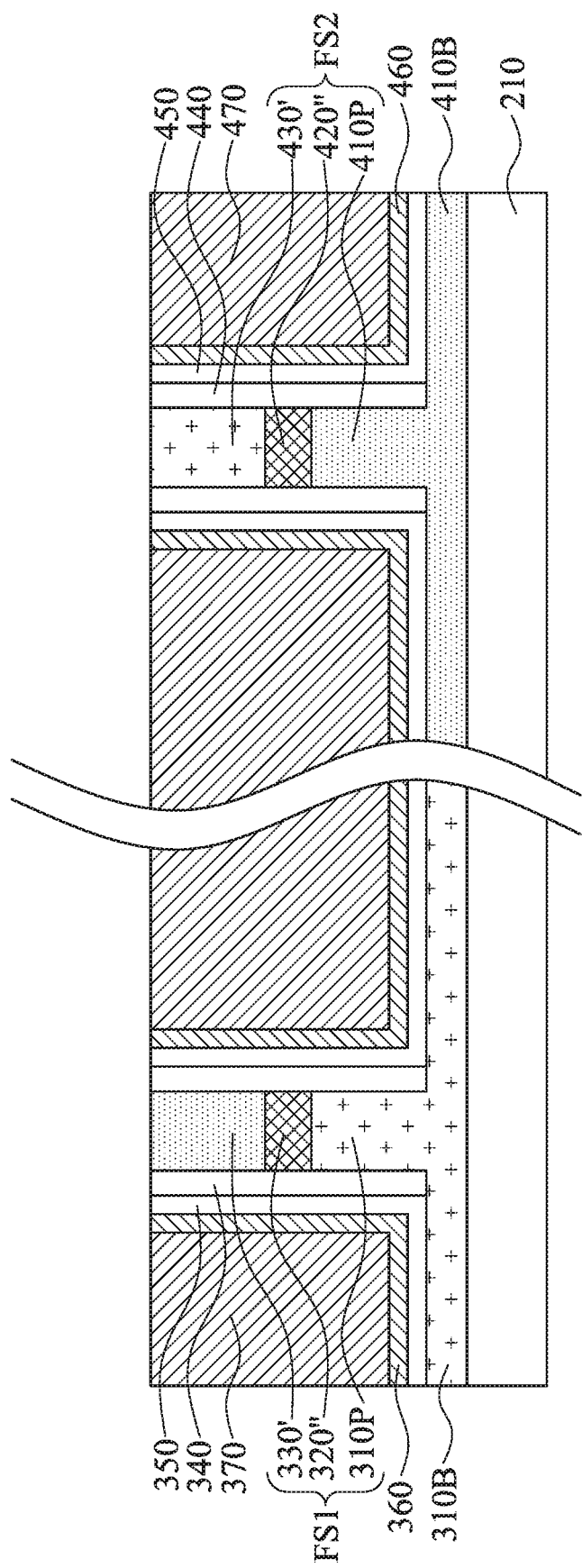

Referring to FIG. 9, the method 100 proceeds to operation 116 where a chemical-mechanical polish (CMP) process is performed to remove a portion of the gate dielectric layer 350, the metal gate layer 360, and the fill metal layer 370 above the fin structure FS1, and remove a portion of the gate dielectric layer 450, the metal gate layer 460, and the fill metal layer 470 above the fin structure FS2. The CMP is performed until the second doped epitaxial layers 330' and 430' are exposed, as illustrated in FIG. 9.

In some embodiments, the CMP process results in the top surface of the fill metal layer 370 substantially level with the second doped epitaxial layer 330'. Similarly, the CMP process results in the top surface of the fill metal layer 470 substantially level with the top surfaces of the second doped epitaxial layer 430'.

Figure 10:
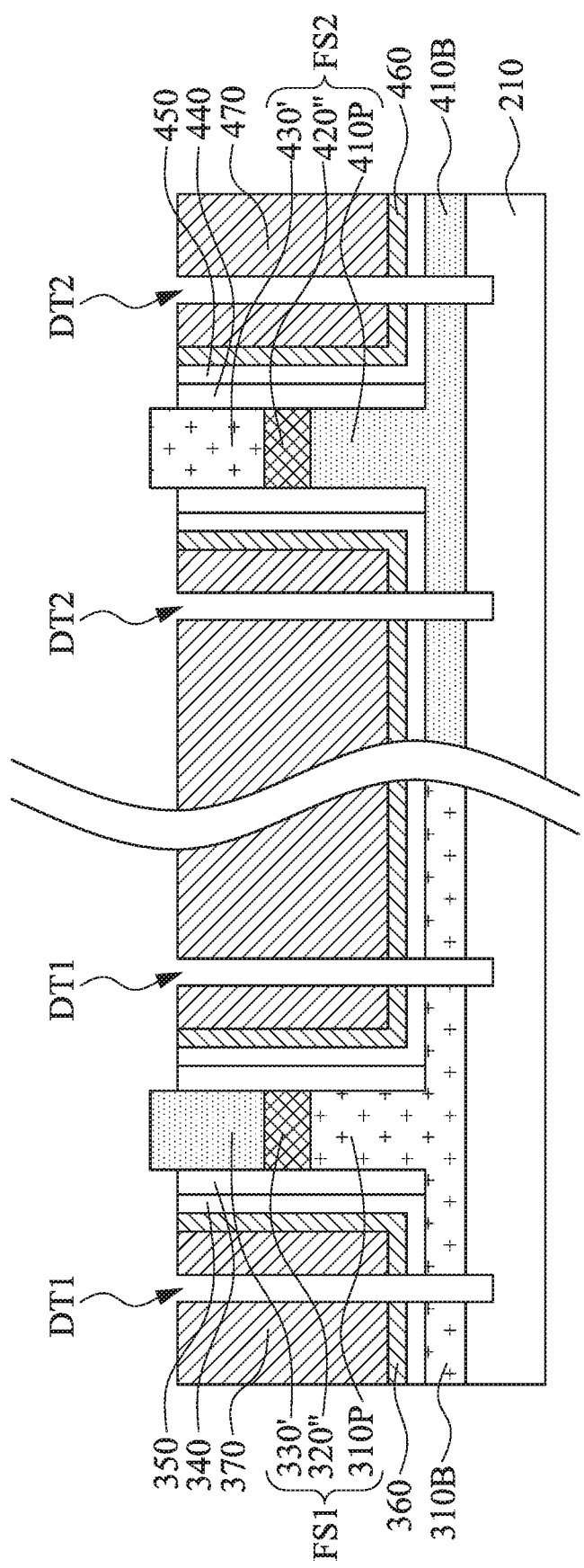

Referring to FIG. 10, the method 100 proceeds to operation 118 where trenches DT1 and DT2 are formed in the fill metal layers 370 and 470. The trenches DT1 may further extend through the gate dielectric layer 350, the metal gate layer 360, and the bottom portion 310B of the first doped epitaxial layer 310', to the substrate 210. Similarly, the trenches DT2 may further extend through the dielectric layer 450, the metal gate layer 460, and the bottom portion 410B of the first doped epitaxial layer 410', to the substrate 210. Through the configuration of the trenches DT1 and DT2, portions of the metal gate layer 360 and the fill metal layer 370 surrounding the fin structure FS1 are separated from portions of the metal gate layer 460 and the fill metal layer 470 surrounding the fin structure FS2.

The trenches DT1 and DT2 may be formed using suitable etching techniques, such as wet etching, dry etching or combinations thereof. In some embodiments, the etching process results in top surfaces of the fill metal layer 370, the metal gate layer 360, and the gate dielectric layer 350 lower than top surfaces of the second doped epitaxial layer 330'. Similarly, the etching process results in top surfaces of the fill metal layer 470, the metal gate layer 460, and the gate dielectric layer 450 are lower than top surfaces of the second doped epitaxial layer 430'. That is, the gate dielectric layer 350 and 450, the metal gate layers 360 and 460, and the fill metal layers 370 and 470 are further pulled back, such that the fin structures FS1 and FS2 protrudes from the gate dielectric layer 350 and 450, the metal gate layers 360 and 460, and the fill metal layers 370 and 470, respectively.

Figure 11:
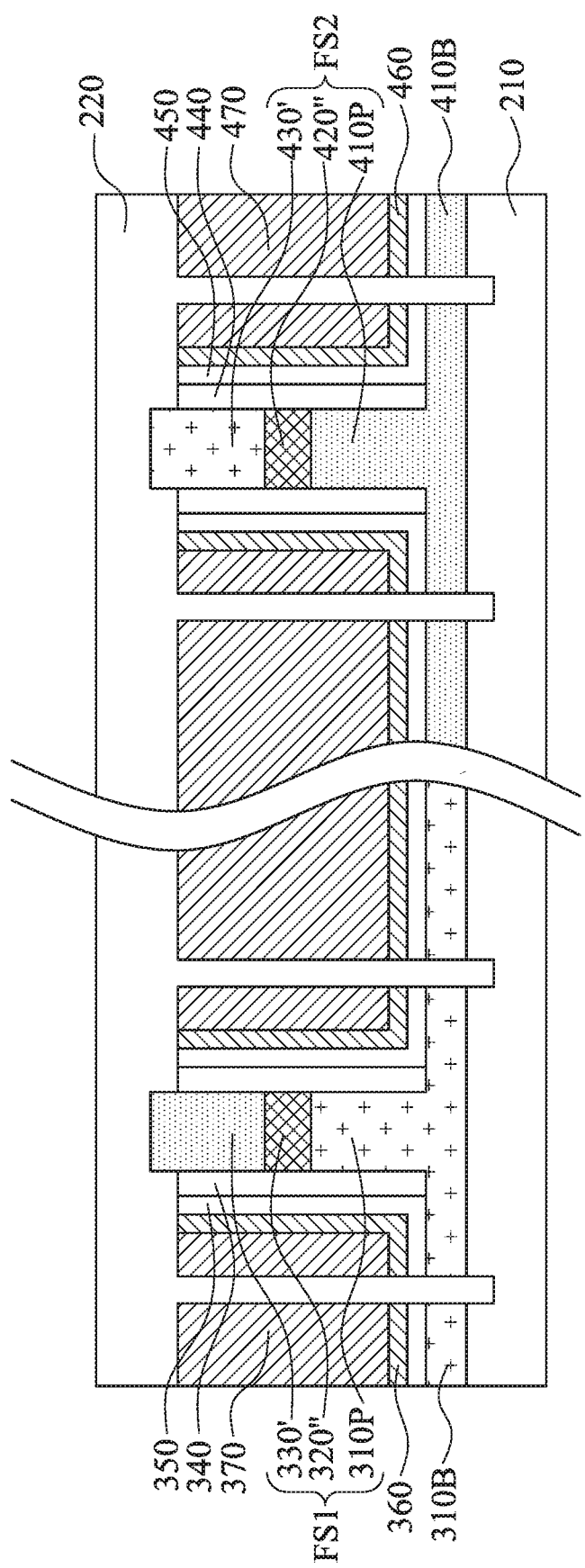

Referring to FIG. 11, the method 100 proceeds to operation 120 where the trenches DT1 and DT2 are filled with a dielectric layer 220, such that the metal gate layers 360 and 460 surrounding the fin structures FS1 and FS2 respectively are electrically isolated from each other, and the fill metal layers 370 and 470 surrounding the fin structures FS1 and FS2 respectively are electrically isolated from each other. Herein, the trenches DT1 and DT2 are overfilled with the dielectric layer 220 by using, for example, CVD, PVD, spin-coating, the like, or combinations thereof. Overfilling the trenches DT1 and DT2 results in that the fill metal layers 370 and 470, the metal gate layers 360 and 460, the gate dielectric layer 350 and 450, the second doped epitaxial layers 330' and 430', and first doped epitaxial layers 310' and 410' covered by the dielectric layer 220.

Figure 12A:
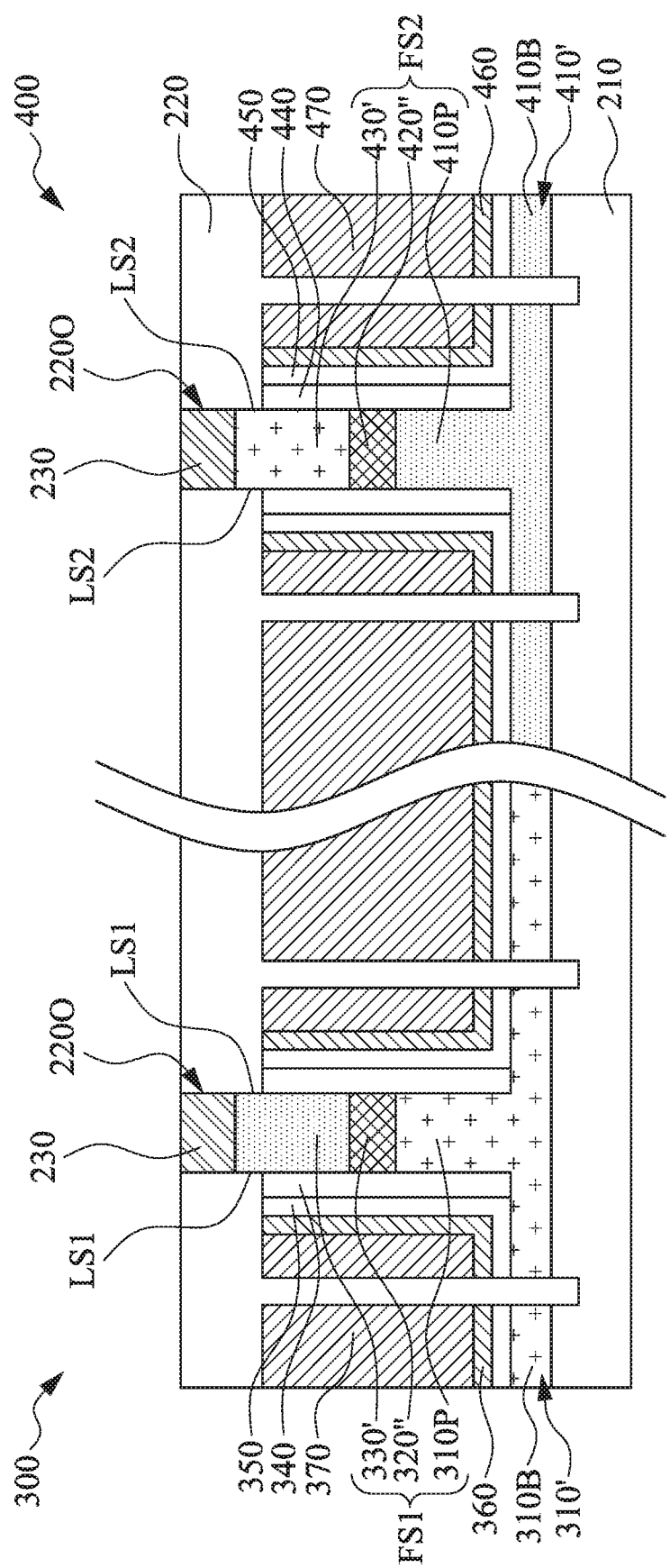
Figure 12B:
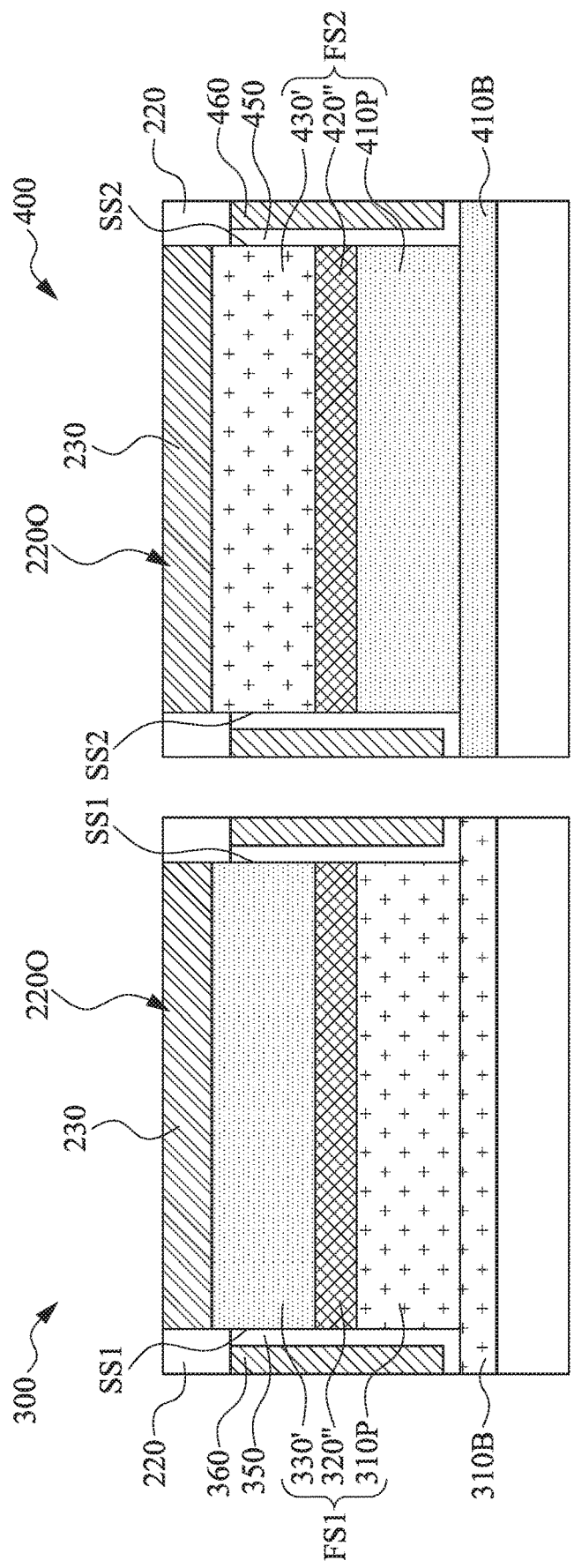

Referring to FIG. 12A and FIG. 12B, the method 100 proceeds to operation 122 where source/drain contacts 230 are formed in the dielectric layer 220. Herein, openings 2200 are formed in the dielectric layer 220 to expose the fin structures FS1 and FS2, and a conductive material fills the openings 2200 and forms the source/drain contacts 230. To be specific, the openings 2200 expose the second doped epitaxial layers 330' and 430', such that the source/drain contacts 230 may be in contact with the second doped epitaxial layers 330' and 430'. Herein, the openings 2200 have a size similar to that of the fin structures FS1 and FS2, such that top surfaces of the intrinsic semiconductor layers 340 and 440 are covered by the dielectric layer 220. Further TFET processes are performed to form various features such as contacts/vias, interlayer dielectric layers, interconnect metal layers, and passivation layers, etc. Through above operations, an n-type TFET 300 and a p-type TFET 400 are formed through an integrated fabrication process.

The n-type first doped epitaxial layers 310' and the p-type second epitaxial layer 330' can be respectively referred to as an n-type drain layer and a p-type source layer of the n-type TFET 300. In some embodiments of the n-type TFET 300, tunneling occurs from the p-type source-layer 330' to the intrinsic semiconductor layer 340. To this end, electron tunneling occurs from the p-type source-layer 330' to the intrinsic semiconductor layer 340, and then current flows vertically through to the drain-layer 310'. Similarly, the p-type first doped epitaxial layers 410' and the n-type second epitaxial layer 430' can be respectively referred to as a p-type drain-layer and an n-type source-layer of a p-type TFET 400. In some embodiments of p-type TFET 400, tunneling occurs from the n-type source-layer 430' into the intrinsic semiconductor layer 440. In some embodiments, top surfaces of the intrinsic semiconductor layers 340 and 440 are lower than bottom surfaces of the source/drain contacts 230, respectively, such that the intrinsic semiconductor layers 340 and 440 which may be made of the same material as that of the drain layers (e.g., first doped epitaxial layers 310' and 410') are not in contact with the source/drain contacts 230.

In some embodiments, due to the presence of the insulation layers 320" and 420", a leakage current between the drain layer and the source layer is inhibited, such as when voltage is not applied to the metal gate layers 360 and 460. Stated differently, the insulation layers 320" and 420" contribute to reduction of the off-current of the TFETs 300 and 400.

Figure 13:
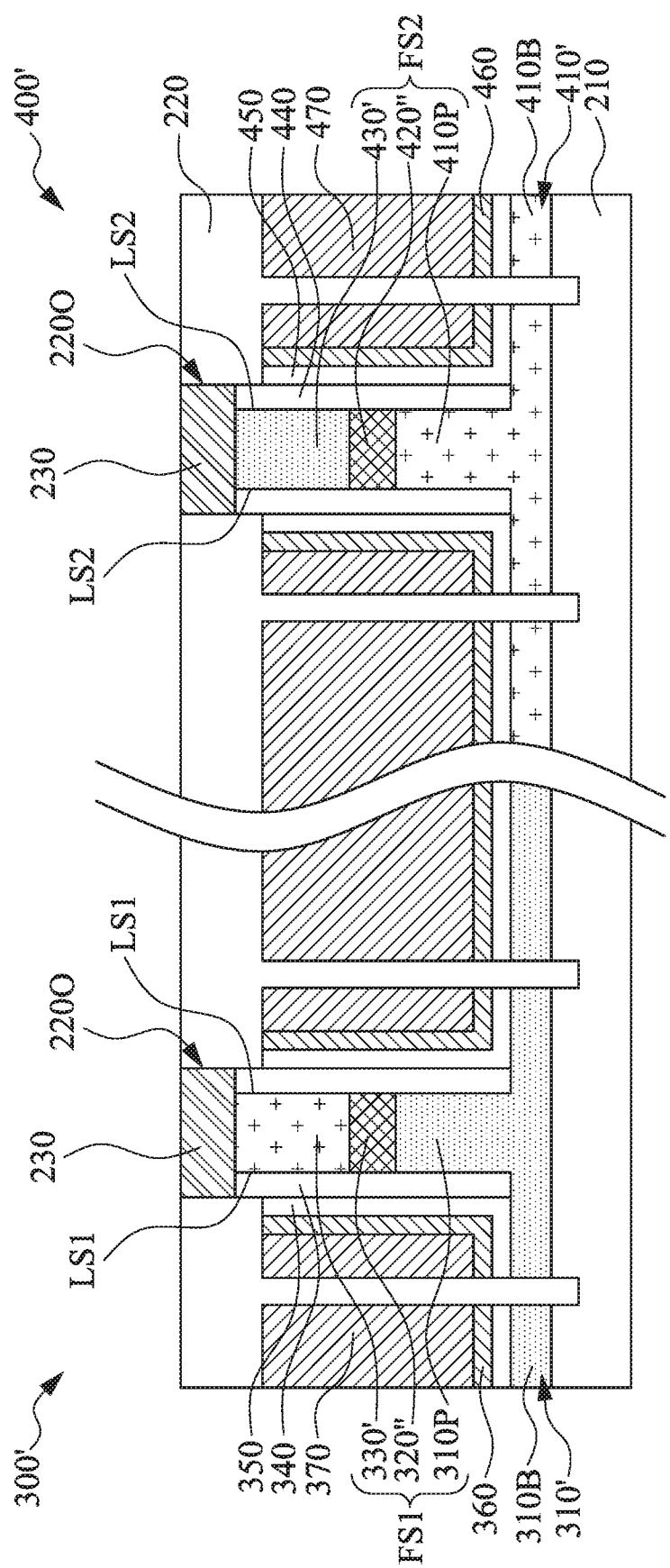
FIG. 13 is a cross-sectional view of TFETs in accordance with some embodiments of the present disclosure.

FIG. 13 is a cross-sectional view of TFETs in accordance with some embodiments of the present disclosure. An n-type TFET 300' and a p-type TFET 400' are depicted herein. In some embodiments, the first doped epitaxial layer 310' is doped by a p-type dopant, such as, but not limited to, magnesium, calcium, zinc, beryllium, carbon, and combinations thereof. The second doped epitaxial layer 330' is doped by an n-type dopant, such as, but not limited to, silicon, oxygen, or a combination thereof. The p-type first doped epitaxial layers 310' and the n-type second epitaxial layer 330' can be respectively referred to as an p-type source-layer and a n-type drain-layer of the n-type TFET 300', respectively.

In some embodiments, the first doped epitaxial layer 410' is doped by an n-type dopant, such as, but not limited to, silicon, oxygen, or a combination thereof. The second doped epitaxial layer 430' is doped by a p-type dopant, such as, but not limited to, magnesium, calcium, zinc, beryllium, carbon, and combinations thereof. The n-type first doped epitaxial layers 410' and the p-type second epitaxial layer 430' can be respectively referred to as an n-type source-layer and a p-type drain-layer of the p-type TFET 400', respectively.

As illustrated previously, the first doped epitaxial layer 310' and 410' and the second doped epitaxial layers 330' and 430' are formed of a III-V semiconductor with a Zinc blende crystal structure. For example, the first doped epitaxial layers 310' and 410' and the second doped epitaxial layers 330' and 430' are made of $Ga_xIn_{1-x}As_ySb_{1-y}$ wherein "x" is in a range from about 0 to about 1, and "y" is in a range from about 0 to about 1. Herein, the "x" and "y" in the first doped epitaxial layer 310' are different from that in the second doped epitaxial layer 330'. The "x" and "y" in the first doped epitaxial layer 410' are different from that in the second doped epitaxial layer 430'. In further embodiments, the first doped epitaxial layer 310' may be made of GaSb, while the second doped epitaxial layer 330' may be made of InAs. In some embodiments, the first doped epitaxial layer 410' may be made of InAs, while the second doped epitaxial layer 430' may be made of GaSb. The first doped epitaxial layer 310' and 410' and the second doped epitaxial layers 330' and 430' may respectively have a thickness greater than 20 nanometers.

The intrinsic semiconductor layers 340 and 440 may be made of the same material as that of the drain layers of TFETs 300' and 400', such as second doped epitaxial layers 330' and 430'. To be specific, the intrinsic semiconductor layers 340 and 440 may be made of $Ga_xIn_{1-x}As_ySb_{1-y}$ wherein "x" is in a range from about 0 to about 1, and "y" is in a range from about 0 to about 1. For example, the intrinsic semiconductor layer 340 may be made of InAs. For example, the intrinsic semiconductor layer 440 may be made of GaSb. It should not limit the scope of the present embodiments.

In the present embodiments, the openings 2200 have a size greater than that of the fin structures FS1 and FS2, such that top surfaces of the intrinsic semiconductor layers 340 and 440 are further exposed by the openings 2200, and the source/drain contacts 230 are further in contact with the intrinsic semiconductor layers 340 and 440, respectively. Other embodiments of the present disclosure are similar to that of FIG. 12A, and not repeated herein.

Figure 14:
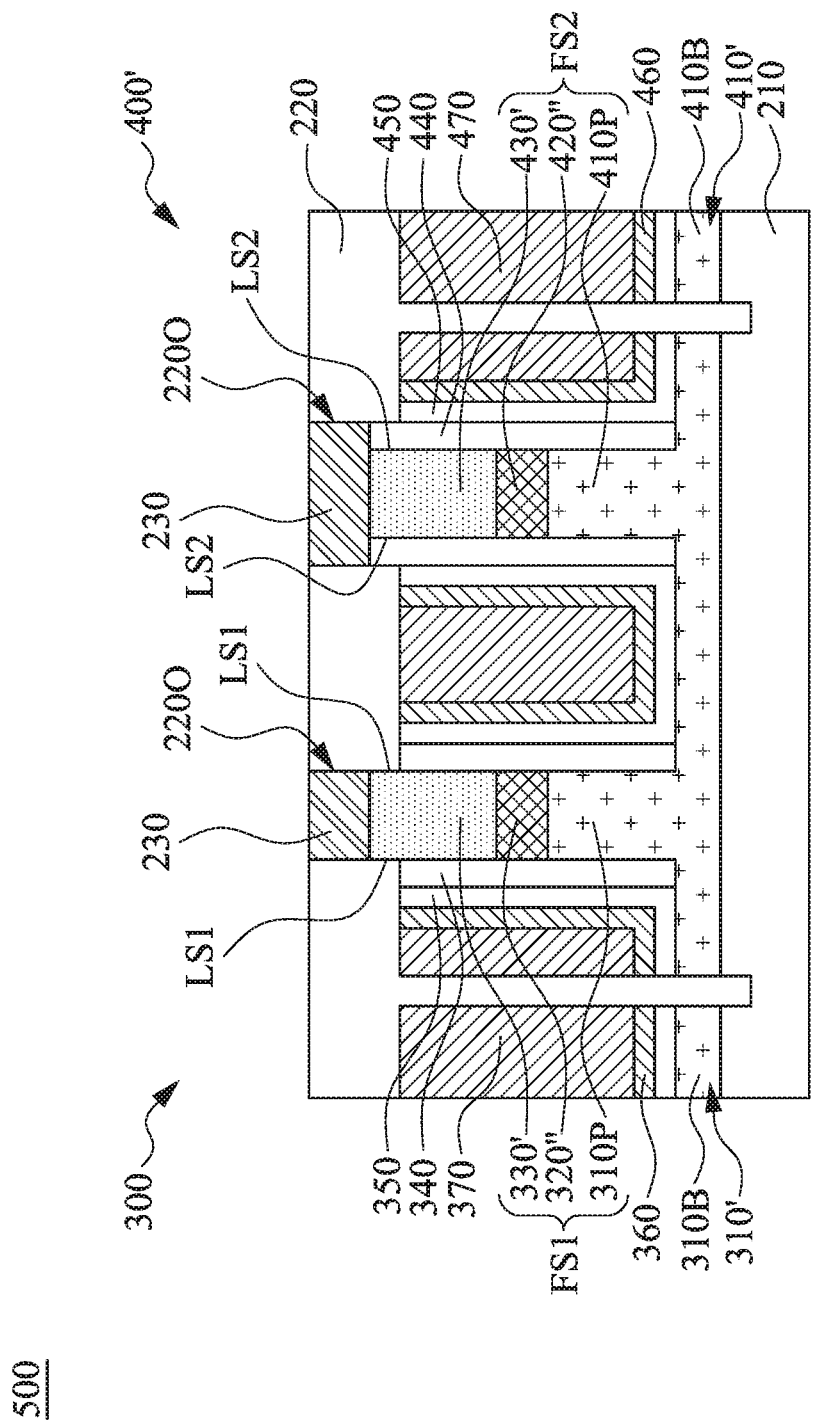
FIG. 14 is a cross-sectional view of an integrated circuit in accordance with some embodiments of the present disclosure.

FIG. 14 is a cross-sectional view of an integrated circuit in accordance with some embodiments of the present disclosure. An inverter 500 includes the aforementioned n-type TFET 300 in FIG. 12A and p-type TFET 400' in FIG. 13. The metal gate layers 360 and 460 are electrically connected, and the drain-layer (i.e. first doped epitaxial layer 310') of the n-type TFET 300 is connected to the source-layer (i.e. first doped epitaxial layer 410') of the p-type TFET 400', so as to form the inverter 500. As aforementioned, in some embodiments, a top surface of the intrinsic semiconductor layer 340 is lower than a bottom surface of the source/drain contact 230, such that the intrinsic semiconductor layers 340 is not in contact with the source/drain contact 230. In some embodiments, a top surface of the intrinsic semiconductor layer 440 may be in contact with the source/drain contacts 230.

Herein, the n-type TFET 300 and p-type TFET 400' may be formed through an integrated fabrication process, thereby reducing process cost. For example, the first doped epitaxial layers 310' and 410' may be formed of the same material, such as InAs, and doped with n-type dopants. The second doped epitaxial layers 330' and 430' may be formed of the same material, such as GaSb, and doped with p-type dopants. The intrinsic semiconductor layers 340' and 440' may be made of the different materials. For example, the intrinsic semiconductor layers 340' and 440' may be made of InAs and GaSb, respectively.

In some other embodiments, the n-type TFET 300' in FIG. 13 and p-type TFET 400 in FIG. 12A may be formed through an integrated fabrication process, thereby reducing process cost.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by employing an oxidation treatment to form an insulation layer between source and drain layers, leakage current may be effectively reduced. Another advantage is that on-current per chip area is improved by designing the TFET with a vertical intrinsic semiconductor layer. Yet another advantage is that the intrinsic semiconductor layer may be naturally formed on opposite sides of the fin structure due to the dependency of growth rates and etching rate on different crystal planes.

According to some embodiments of the present disclosure, a device includes a first semiconductor layer, a second semiconductor layer, and an intrinsic semiconductor layer. The second semiconductor layer is over the first semiconductor layer. The first semiconductor layer and the second semiconductor layer are of opposite conductivity types. The second semiconductor layer includes a first sidewall and a second sidewall substantially perpendicular to and larger than the first sidewall. The intrinsic semiconductor layer is in contact with the second sidewall of the second semiconductor layer and the first semiconductor layer.

In some embodiments, the first semiconductor layer includes a bottom portion and a protruding portion protruding from the bottom portion and including a third sidewall and a fourth sidewall substantially perpendicular to and larger than the third sidewall. The intrinsic semiconductor layer is in contact with the fourth sidewall.

In some embodiments, the first sidewall of the second semiconductor layer is substantially free from coverage by the intrinsic semiconductor layer.

In some embodiments, one of the first sidewall and the second sidewall of the second semiconductor layer extends substantially along a (110) crystal plane.

In some embodiments, another of the first sidewall and the second sidewall of the second semiconductor layer extends substantially along a (1-10) crystal plane.

In some embodiments, one of the first sidewall and the second sidewall of the second semiconductor layer extends substantially along a (−110) crystal plane.

In some embodiments, another of the first sidewall and the second sidewall of the second semiconductor layer extends substantially along a (11-2) crystal plane.

In some embodiments, the device further includes a dielectric layer between the first semiconductor layer and the second semiconductor layer. The dielectric layer includes a metal element, and the first semiconductor layer, the second semiconductor layer, and the intrinsic semiconductor layer are substantially free from the metal element of the dielectric layer.

In some embodiments, the device further includes a dielectric layer between the first semiconductor layer and the second semiconductor layer. The dielectric layer includes aluminum oxide.

In some embodiments, the first semiconductor layer and the second semiconductor layer are made of different III-V compound materials.

In some embodiments, the III-V compound materials of the first semiconductor layer and of the second semiconductor layer have zinc blende crystal structures.

According to some embodiments of the present disclosure, a device includes a substrate, a fin structure, and an intrinsic semiconductor layer. The fin structure is over the substrate. The fin structure includes a first semiconductor layer, a dielectric layer over the first semiconductor layer, and a second semiconductor layer over the dielectric layer. The first semiconductor layer and the second semiconductor layer are of opposite conductivity types. The intrinsic semiconductor layer extends from the first semiconductor layer to the second semiconductor layer across the dielectric layer.

In some embodiments, the fin structure has a first sidewall and a second sidewall substantially perpendicular to and larger than the first sidewall, and the first sidewall is substantially free from coverage by the intrinsic semiconductor layer.

In some embodiments, the dielectric layer includes a Group III element absent from the first semiconductor layer, the second semiconductor layer and the intrinsic semiconductor layer.

In some embodiments, the dielectric layer is an oxide of the Group III element.

In some embodiments, the device further includes a source/drain contact in contact with the second semiconductor layer and the intrinsic semiconductor layer.

In some embodiments, the device further includes a source/drain contact in contact with the second semiconductor layer. A top surface of the intrinsic semiconductor layer is lower than a bottom surface of the source/drain contact.

According to some embodiments of the present disclosure, a method includes forming a first type semiconductor layer; forming a semiconductor interlayer over the first type semiconductor layer; forming a second type semiconductor layer over the semiconductor interlayer; etching the first type semiconductor layer, the semiconductor interlayer, and the second type semiconductor layer to form a fin structure; and performing an oxidation treatment to oxidize the semiconductor interlayer.

In some embodiments, the method further includes forming an intrinsic semiconductor layer on a sidewall of the fin structure prior to performing the oxidation treatment.

In some embodiments, an oxidation rate of the semiconductor interlayer is faster than oxidation rates of the first type semiconductor layer, of the second type semiconductor layer and of the intrinsic semiconductor layer during the oxidation treatment.

According to some embodiments of the present disclosure, a method for manufacturing a semiconductor structure includes forming a first type semiconductor layer. The method also includes forming a semiconductor interlayer over the first type semiconductor layer. The method further includes forming a second type semiconductor layer over the semiconductor interlayer. The method further includes etching the first type semiconductor layer, the semiconductor interlayer, and the second type semiconductor layer to form a fin structure. The method further includes oxidizing the semiconductor interlayer.

According to some embodiments of the present disclosure, a method for manufacturing a semiconductor structure includes forming a first doped epitaxial layers, an interlayer, and a second doped epitaxial layer over a substrate. The method also includes patterning the first doped epitaxial layer, the interlayer, and the second doped epitaxial layer to form a fin structure. The method further includes forming an intrinsic layer on a sidewall of the fin structure. The method further includes oxidizing the interlayer. The method further includes forming a gate dielectric layer surrounding the fin structure.

According to some embodiments of the present disclosure, a method for manufacturing a semiconductor structure includes forming a first doped epitaxial layer with a first conductive type. The method also includes depositing an intrinsic interlayer over the first doped epitaxial layer. The method further includes depositing a second doped epitaxial layer with a second conductive type over the intrinsic interlayer. The method further includes etching the first doped epitaxial layer, the intrinsic interlayer, and the second doped epitaxial layer to form a fin structure. The method further includes forming an intrinsic semiconductor layer over the first doped epitaxial layer, the intrinsic interlayer, and the second doped epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first type semiconductor layer;
    forming a semiconductor interlayer over the first type semiconductor layer;
    forming a second type semiconductor layer over the semiconductor interlayer;
    etching the first type semiconductor layer, the semiconductor interlayer, and the second type semiconductor layer to form a fin structure; and
    oxidizing the semiconductor interlayer.

2. The method for manufacturing a semiconductor structure as claimed in claim 1, further comprising:
    forming an intrinsic semiconductor layer on a sidewall of the fin structure prior to oxidizing the semiconductor interlayer.

3. The method for manufacturing a semiconductor structure as claimed in claim 2, wherein an oxidation rate of the semiconductor interlayer is faster than oxidation rates of the first type semiconductor layer, of the second type semiconductor layer and of the intrinsic semiconductor layer during oxidizing the semiconductor interlayer.

4. The method for manufacturing a semiconductor structure as claimed in claim 2, wherein the intrinsic semiconductor layer comprises a III-V semiconductor with a Zinc blende crystal structure.

5. The method for manufacturing a semiconductor structure as claimed in claim 1, further comprising:
surface treating the first type semiconductor layer and the second type semiconductor layer.

6. The method for manufacturing a semiconductor structure as claimed in claim 1, wherein the first type semiconductor layer and the second type semiconductor layer comprise aluminum-free III-V compound semiconductor.

7. The method for manufacturing a semiconductor structure as claimed in claim 1, wherein the semiconductor interlayer comprises aluminum-containing semiconductor.

8. A method for manufacturing a semiconductor structure, comprising:
forming a first doped epitaxial layers, an interlayer, and a second doped epitaxial layer over a substrate;
patterning the first doped epitaxial layer, the interlayer, and the second doped epitaxial layer to form a fin structure;
forming an intrinsic layer on a sidewall of the fin structure;
oxidizing the interlayer; and
forming a gate dielectric layer surrounding the fin structure.

9. The method for manufacturing a semiconductor structure as claimed in claim 8, further comprising:
forming a gate electrode layer surrounding the fin structure and the gate dielectric layer;
forming a fill metal layer over the gate electrode layer;
chemical-mechanical polishing the fill metal layer;
forming a trench in the fill metal layer;
filling the trench with a dielectric layer; and
forming interconnect structures in the dielectric layer.

10. The method for manufacturing a semiconductor structure as claimed in claim 9, wherein after forming the trench in the fill metal layer, top surfaces of the fill metal layer, the gate electrode layer, and the gate dielectric layer are lower than a top surface of the second doped epitaxial layer.

11. The method for manufacturing a semiconductor structure as claimed in claim 9, wherein after filling the trench with the dielectric layer, a top surface of the intrinsic layer is covered by the dielectric layer.

12. The method for manufacturing a semiconductor structure as claimed in claim 9, wherein forming interconnect structures in the dielectric layer includes forming a source/drain contact separated from the intrinsic layer.

13. The method for manufacturing a semiconductor structure as claimed in claim 8, wherein the interlayer turns into an insulation layer after oxidizing the interlayer.

14. A method for manufacturing a semiconductor structure, comprising:
forming a first doped epitaxial layer with a first conductive type;
depositing an intrinsic interlayer over the first doped epitaxial layer;
depositing a second doped epitaxial layer with a second conductive type over the intrinsic interlayer;
etching the first doped epitaxial layer, the intrinsic interlayer, and the second doped epitaxial layer to form a fin structure; and
forming an intrinsic semiconductor layer over the first doped epitaxial layer, the intrinsic interlayer, and the second doped epitaxial layer.

15. The method for manufacturing a semiconductor structure as claimed in claim 14, wherein the fin structure has a first sidewall and a third sidewall on opposite sides and a second sidewall adjacent to and larger than the first sidewall and the third sidewall.

16. The method for manufacturing a semiconductor structure as claimed in claim 15, wherein the intrinsic semiconductor layer has a different growth rate on the first sidewall and the second sidewall when forming the intrinsic semiconductor layer.

17. The method for manufacturing a semiconductor structure as claimed in claim 15, further comprising:
removing the intrinsic semiconductor layer over the first sidewall.

18. The method for manufacturing a semiconductor structure as claimed in claim 17, wherein the intrinsic semiconductor layer has a different etching rate on the first sidewall and the second sidewall when removing the intrinsic semiconductor layer.

19. The method for manufacturing a semiconductor structure as claimed in claim 17, wherein the first sidewall is exposed and the third sidewall is covered by the intrinsic semiconductor layer after removing the intrinsic semiconductor layer.

20. The method for manufacturing a semiconductor structure as claimed in claim 17, wherein the first sidewall and the third sidewall are exposed after removing the intrinsic semiconductor layer.

* * * * *